United States Patent
Cagnina et al.

(10) Patent No.: US 6,362,049 B1
(45) Date of Patent: Mar. 26, 2002

(54) HIGH YIELD PERFORMANCE SEMICONDUCTOR PROCESS FLOW FOR NAND FLASH MEMORY PRODUCTS

(75) Inventors: Salvatore F. Cagnina, Los Altos; Hao Fang, Cupertino; John Jianshi Wang, San Jose; Kent Kuohua Chang, Cupertino; Masaatzi Higashitani, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/435,213

(22) Filed: Nov. 5, 1999

Related U.S. Application Data

(60) Provisional application No. 60/111,012, filed on Dec. 4, 1998.

(51) Int. Cl.[7] .............................................. H01L 21/336
(52) U.S. Cl. ................... 438/258; 257/315; 365/185.33
(58) Field of Search ................................. 257/314, 315, 257/321; 365/185.33; 438/257, 258

(56) References Cited

U.S. PATENT DOCUMENTS

| | | | |
|---|---|---|---|
| 5,514,889 A | | 5/1996 | Cho et al. .................... 257/316 |
| 5,732,021 A | | 3/1998 | Smayling et al. ........ 365/185.29 |
| 5,856,221 A | * | 1/1999 | Clementi et al. ............ 438/258 |
| 5,888,869 A | * | 3/1999 | Cho et al. .................... 438/258 |
| 5,907,171 A | * | 5/1999 | Santin et al. ................. 257/315 |
| 5,966,618 A | * | 10/1999 | Sun et al. ..................... 438/452 |
| 6,043,123 A | * | 3/2000 | Wang et al. ................. 438/258 |
| 6,046,085 A | * | 4/2000 | Chan ............................ 438/257 |
| 6,159,795 A | * | 12/2000 | Higashitani et al. ......... 438/257 |
| 6,180,456 B1 | * | 1/2001 | Lam et al. .................... 438/258 |
| 6,218,689 B1 | * | 4/2001 | Chang et al. ................ 257/288 |
| 6,228,746 B1 | * | 5/2001 | Ibok ............................. 438/425 |
| 6,249,036 B1 | * | 6/2001 | Kajita et al. ................. 257/509 |

FOREIGN PATENT DOCUMENTS

| | | |
|---|---|---|
| DE | 4340405 A1 | 6/1994 |
| EP | 0545082 A3 | 6/1993 |
| EP | 0545082 A2 | 6/1993 |
| EP | 0663695 A3 | 7/1995 |
| EP | 0663695 A2 | 7/1995 |
| EP | 0810667 A3 | 12/1997 |
| EP | 0810667 A2 | 12/1997 |

* cited by examiner

Primary Examiner—Richard Elms
Assistant Examiner—Christian D. Wilson
(74) Attorney, Agent, or Firm—Amin & Turocy, LLP

(57) ABSTRACT

A semiconductor process for fabricating NAND type flash memory devices in a first embodiment includes step which can be performed on a production line which manufactures NOR type flash memory products. A NAND flash memory fabrication process according to a second embodiment simplifies the process and uses fewer masks, thus reducing costs and errors to produce higher yields.

62 Claims, 29 Drawing Sheets

Second NAND Process Flow

| | Process steps | Comment | #Masks |
|---|---|---|---|
| 201 | Silicon start | Skip zero layer mask, etch and PR clean steps | |
| 202 | Core definition & field oxidation | Core s/d mask/etch and 2500Å core field oxide | 1 |
| 203 | Deep n- & p-well formation | Dual well mask (skip n-well), implant and drive | 2 |
| 204 | Peri. Definition & field oxidation | Peripheral s/d mask/etch and 4000Å core field oxide | 1 |
| 205 | Peripheral field & core implants | N-channel field mask/implant & core Vt mask/implant | 2 |
| 206 | Dual tunnel oxide & poly1 | Select gate oxide, Tox mask/etch and tunnel oxide/poly1 | 1 |
| 207 | 1GE, Ch. stop implant & ONO | Poly1 mask/etch, channel stop implant & ONO dep./mask/etch | 2 |
| 208 | 1st gate ox & LV/HV Vt implants | 1st gate ox, 1st Vt mask/imp & Gox mask/2nd Vt imp/etch | 2 |
| 209 | 2nd gate ox, poly2 & w-polycide | 2nd gate oxide and poly2/WSi/SiON dep. (skip poly cap) | |
| 210 | Peripheral & core gate definition | 2nd gate mask/etch blank HV imp and self-align mask/etch | 2 |
| 211 | MDD N- & Pldd implants | Mdd (skip mdd mask) imp/drive & Nldd/Pldd imp | 2 |
| 212 | Spacer & S/D implants | Spacer deposition, spacer etch and n+/p+ s/d implants | 2 |
| 213 | ILD & planazation | HTO/BPTOES deposition and ILD0 polish | |
| 214 | Contact & tungsten plug | Cont. mask/etch, n+ mask/imp (skip p+ mask/imp) & w-plug | 2 |
| 215 | Metal deposition, mask and etch | Metal deposition, mask and etch | 1 |
| 216 | Topside & pad | Topside layer deposition, pad mask/etch and UV-erase | 1 |

Total number of masks: 21

CHANNEL F-N PROGRAMMING     CHANNEL F-N ERASING

HOT ELECTRON PROGRAMMING     F-N TUNNELING ERASE
(DRAIN SIDE)                 (SOURCE SIDE)

(PRIOR ART)

FIG. 3

FIRST NAND PROCESS FLOW

| PROCESS STEPS | COMMENT | #MASKS |
|---|---|---|
| 101 Silicon start & zero layer mask | Zero layer mask, etch and resist clean | 1 |
| 102 Deep n-, p- & n-well formation | Triple well mask, implant and drive | 3 |
| 103 Peri. definition & field oxidation | Peripheral s/d mask/etch and peripheral field oxide | 1 |
| 104 Core Definition & field oxidation | Core s/d mask/etch and core field oxide | 1 |
| 105 Peripheral field & core implants | N-channel field mask/implant & core Vt mask/implant | 2 |
| 106 Dual tunnel oxide & poly1 | Select gate oxide, Tox mask/etch and tunnel oxide/poly1 | 1 |
| 107 1GE, Ch. stop implant & ONO | Poly1 mask/etch, ch. stop imp. & ONO dep./mask/etch | 2 |
| 108 1st gate ox & LV/HV Vt implants | 1st gate ox, LV Vt mask/imp, HV Vt imp/mask & Gox mask/etch | 3 |
| 109 2nd gate ox, poly2 & w-polycide | 2nd gate oxide and poly2/WSi/poly cap/SiON deposition | |
| 110 Peripheral & core gate definition | 2nd gate mask/etch and self-align mask/etch | 2 |
| 111 HV, Mdd & Idd implants | HV mask/imp, Mdd mask/imp/drive & Nldd/Pldd implant | 4 |
| 112 Spacer & S/D implants | Spacer deposition, spacer etch and n+/p+ s/d implants | 2 |
| 113 ILD & planazation | HTO/BPTCES deposition and ILD0 polish | |
| 114 Contact & tungsten plug | Contact mask/etch, n+/p+ contact mask/imp and w-plug | 3 |
| 115 Metal deposition, mask and etch | Metal deposition, mask and etch | 1 |
| 116 Topside & pad | Topside layer deposition, pad mask/etch and UV-erase | 1 |

Total number of masks: 27

Si  SUBTRATE

Si  SUBTRATE

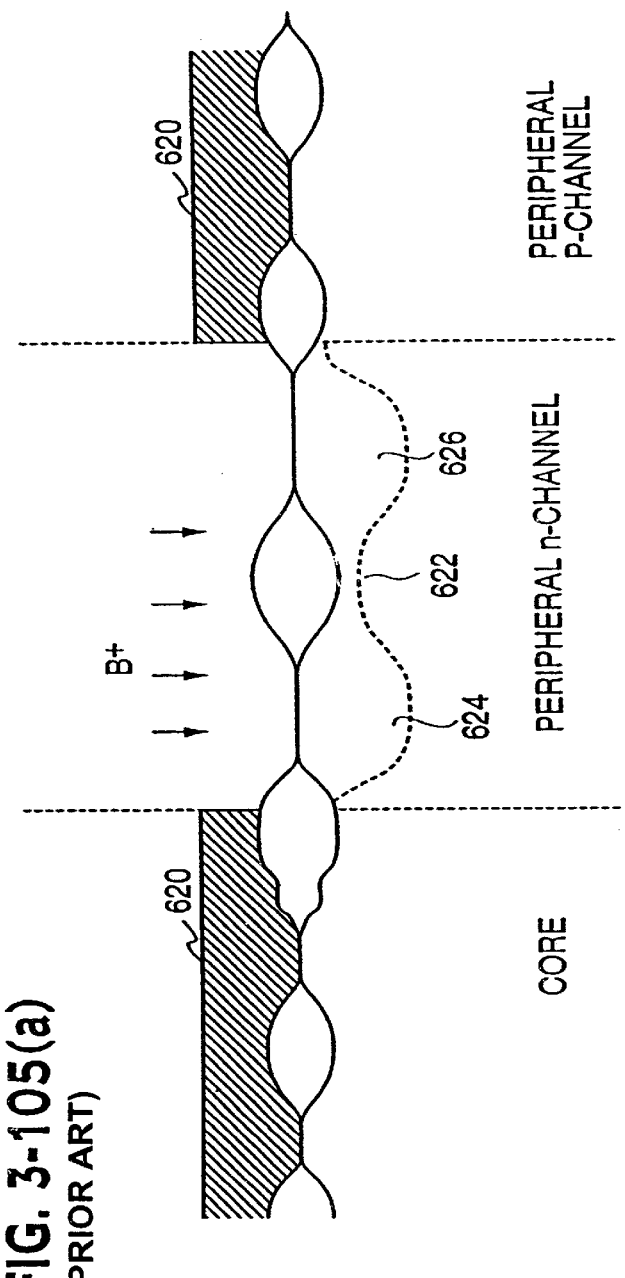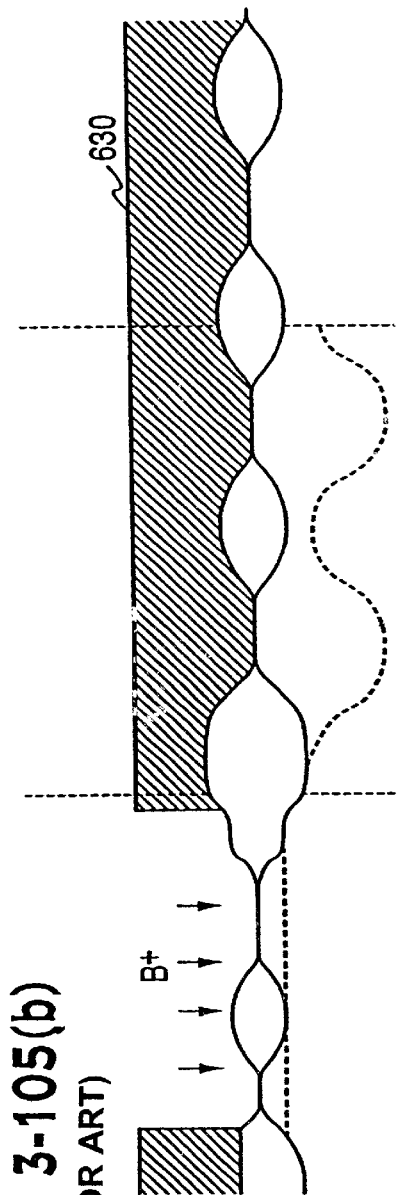
FIG. 3-105(a)
(PRIOR ART)
FIG. 3-105(b)
(PRIOR ART)

FIG. 3-106(a)
(PRIOR ART)
-SGOX (150Å)
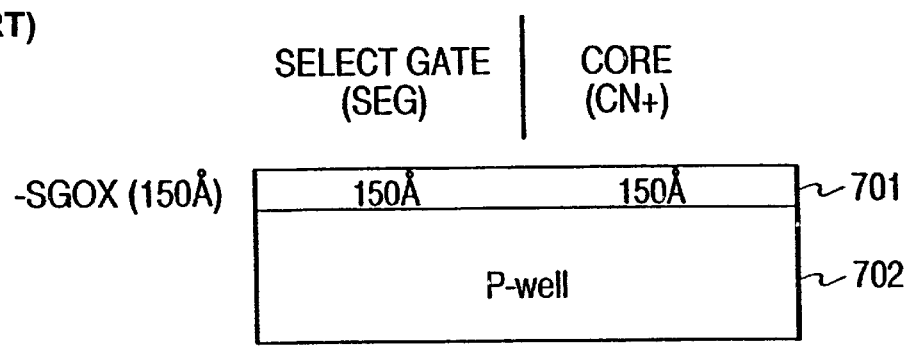
FIG. 3-106(b.)
(PRIOR ART)
-TNOM
-TNOBOE
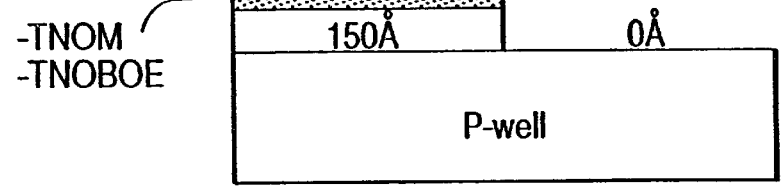
FIG. 3-106(c)
(PRIOR ART) -TOX (95Å)
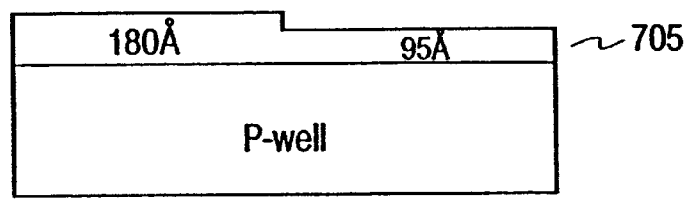

FIG. 3-107(a)
(PRIOR ART) - DEPOSIT POLY1 ON TUNNEL OXIDE
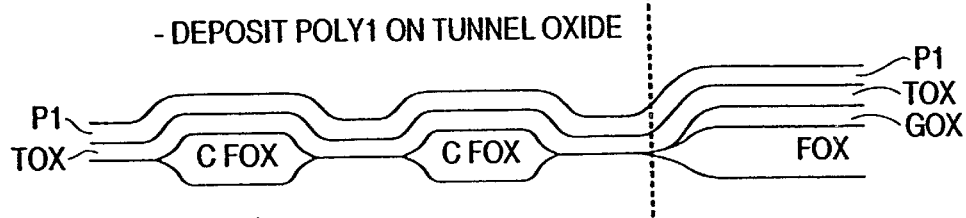
FIG. 3-107(b)
(PRIOR ART) - P1 MASK
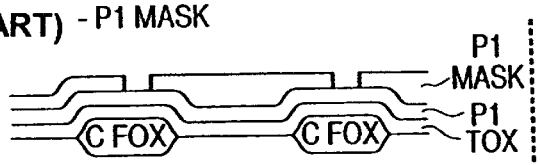
FIG. 3-107(c)
(PRIOR ART) - ETCH
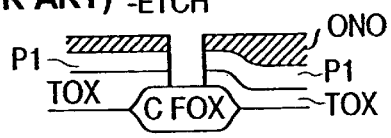
FIG. 3-107(d)
(PRIOR ART) - CHANNEL STOP IMPLANT
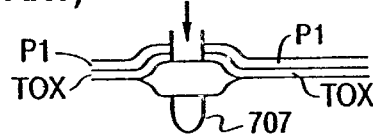
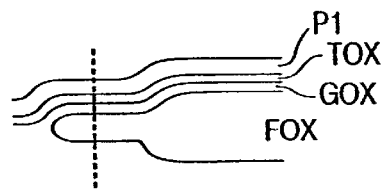
FIG. 3-107(e)
(PRIOR ART) - ONO DEPOSITION/MASK
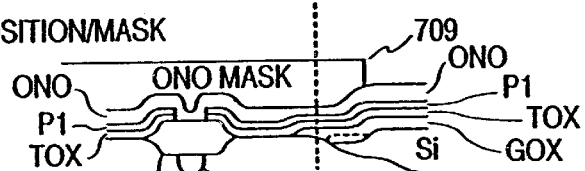
FIG. 3-107(f)
(PRIOR ART) - ETCH
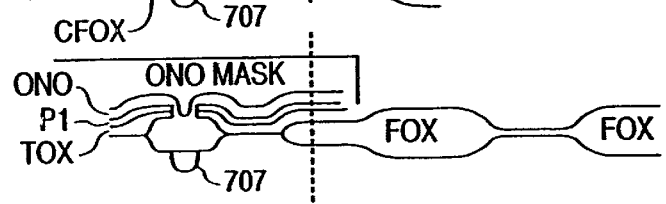
FIG. 3-107(g)
(PRIOR ART) - TOP VIEW
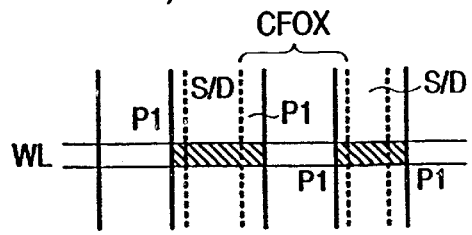

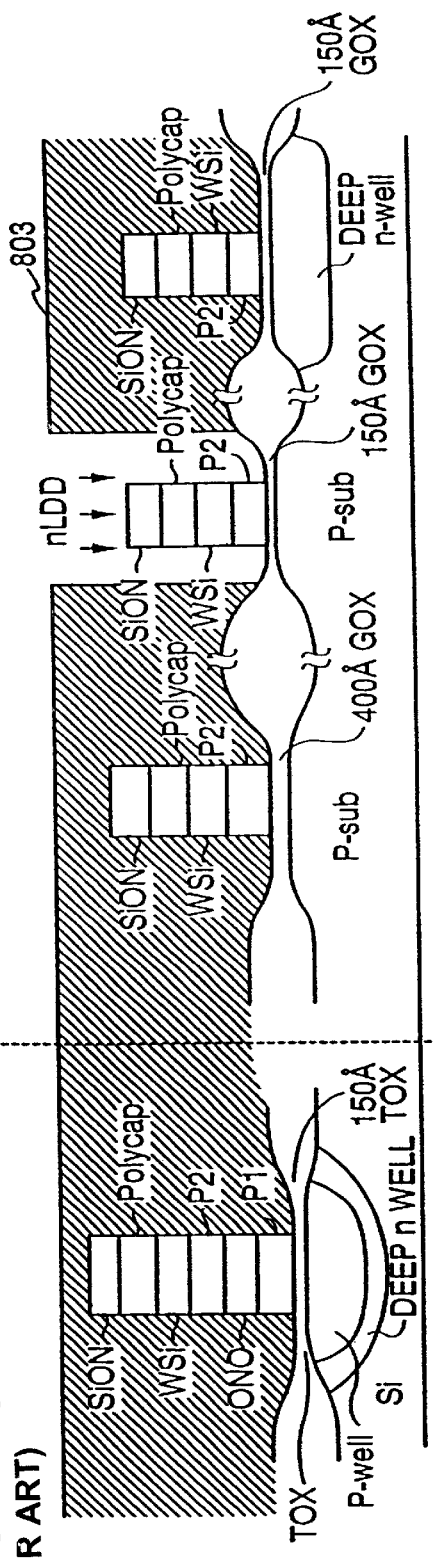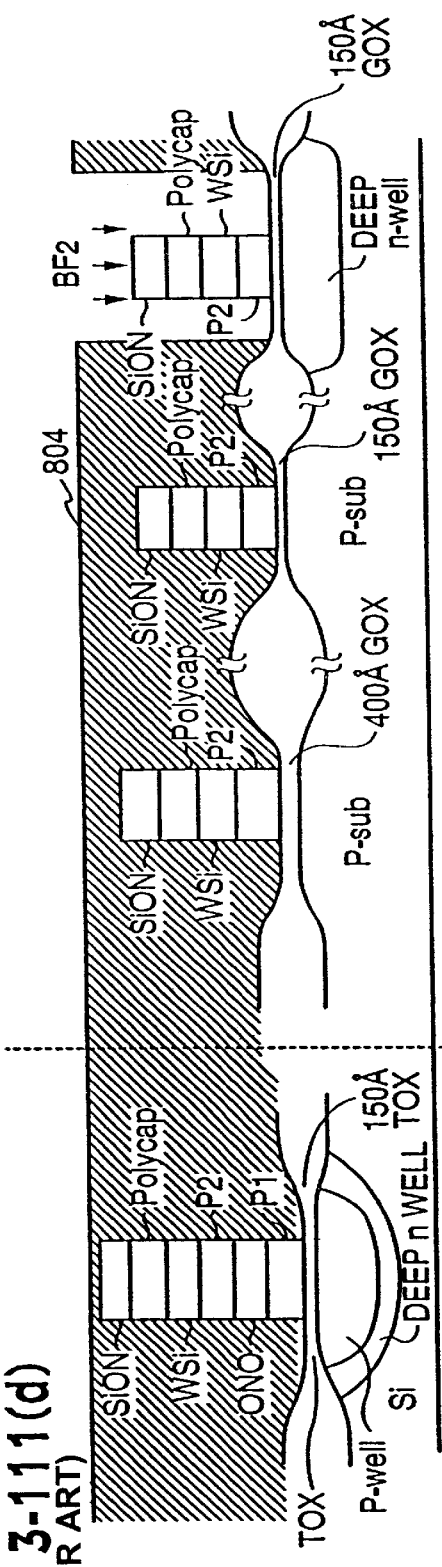
FIG. 3-111(c)
(PRIOR ART)
FIG. 3-111(d)
(PRIOR ART)

FIG. 4

Second NAND Process Flow

| Process steps | Comment | #Masks |
|---|---|---|
| 201 Silicon start | Skip zero layer mask, etch and PR clean steps | |
| 202 Core definition & field oxidation | Core s/d mask/etch and 2500Å core field oxide | 1 |
| 203 Deep n- & p-well formation | Dual well mask (skip n-well), implant and drive | 2 |
| 204 Peri. Definition & field oxidation | Peripheral s/d mask/etch and 4000Å core field oxide | 1 |
| 205 Peripheral field & core implants | N-channel field mask/implant & core Vt mask/implant | 2 |
| 206 Dual tunnel oxide & poly1 | Select gate oxide, Tox mask/etch and tunnel oxide/poly1 | 1 |
| 207 1GE, Ch. stop implant & ONO | Poly1 mask/etch, channel stop implant & ONO dep./mask/etch | 2 |
| 208 1st gate ox & LV/HV Vt implants | 1st gate ox, 1st Vt mask/imp & Gox mask/2nd Vt imp/etch | 2 |
| 209 2nd gate ox, poly2 & w-polycide | 2nd gate oxide and poly2/WSi/SiON dep. (skip poly cap) | |
| 210 Peripheral & core gate definition | 2nd gate mask/etch blank HV imp and self-align mask/etch | 2 |
| 211 MDD N- & Pldd implants | Mdd (skip mdd mask) imp/drive & Nldd/Pldd imp | 2 |
| 212 Spacer & S/D implants | Spacer deposition, spacer etch and n+/p+ s/d implants | 2 |
| 213 ILD & planazation | HTO/BPTOES deposition and ILD0 polish | |
| 214 Contact & tungsten plug | Cont. mask/etch, n+ mask/imp (skip p+ mask/imp) & w-plug | 2 |
| 215 Metal deposition, mask and etch | Metal deposition, mask and etch | 1 |
| 216 Topside & pad | Topside layer deposition, pad mask/etch and UV-erase | 1 |

Total number of masks: 21

CORE | PERIPHERY

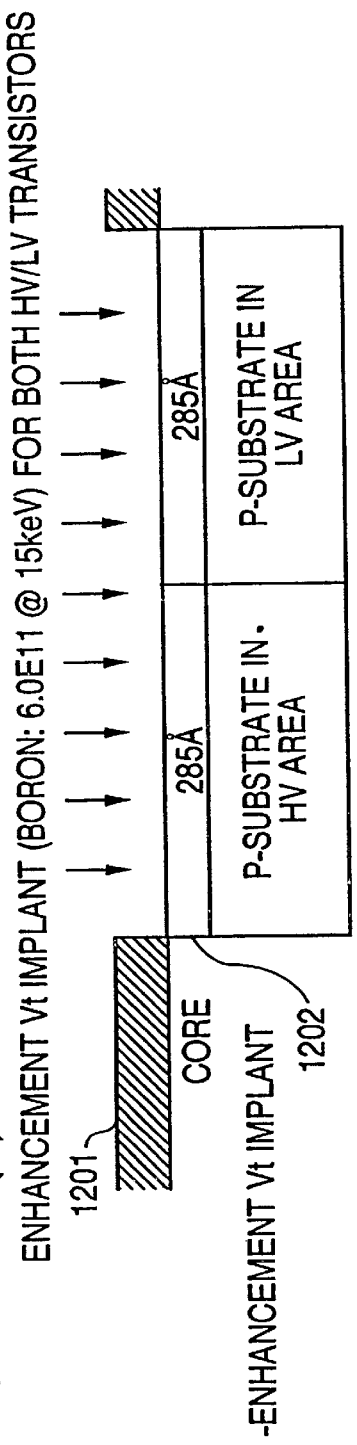
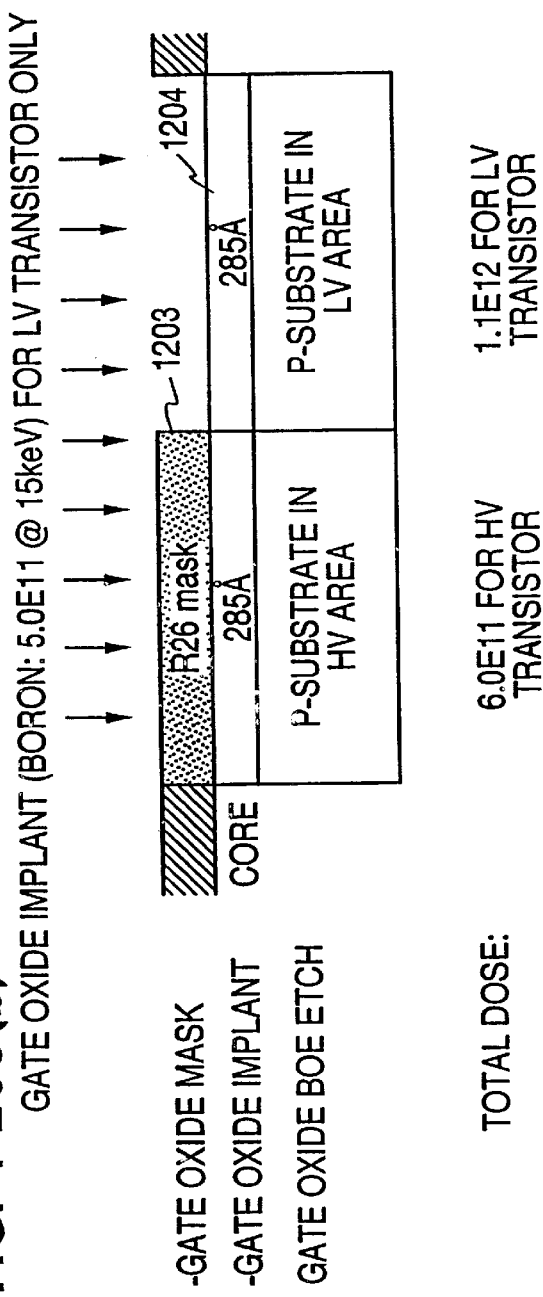

HIGH YIELD PERFORMANCE SEMICONDUCTOR PROCESS FLOW FOR NAND FLASH MEMORY PRODUCTS

This application is a provisional application of No. 60/111,012 filed Dec. 4, 1998.

BACKGROUND OF THE INVENTION

1. Field of the Invention

The invention relates to methods and apparatus for fabricating semiconductor devices, such as memory devices and logic devices.

2. Description of the Related Art

Processes for fabricating semiconductor devices generally require beginning with a silicon substrate and growing or depositing additional layers on the substrate. The various steps require placing a series of masks on the various layers to define the circuitry. By etching around the masks and implanting certain impurities, desired configurations and performance characteristics of circuits are achieved. NAND and NOR type flash memories are examples of semiconductor circuits with different characteristics.

Often a large number of steps and masks and complicated processes are required to construct desired circuits. A significant factor in the manufacturing process is the number of masks which must be used. The greater the number of masks, the greater the number of steps which must be performed. As a result, manufacturing time increases with the number of masks and the cost of the semiconductor device increases accordingly. As a result of market factors, purchasers view many semiconductor devices as commodities. Thus, purchasers of semiconductor devices are highly price sensitive. Reducing the manufacturing time and the number of steps in the manufacturing process is a significant factor in controlling manufacturing costs. The degree of process difficulty is also a factor impacting manufacturing costs. Ways of controlling manufacturing costs include reducing the number of masks and simplifying the processes required to manufacture a semiconductor device. In addition to reducing manufacturing time and lowering costs, reducing the number of masks and simplifying the processes reduce the defect level and errors produced during the manufacturing process. Thus using fewer masks in the manufacturing process tends to increase product yield.

SUMMARY OF THE INVENTION

In view of the factors discussed above, it is an object of the invention to reduce the number of steps and simplify the processes required in the manufacturing process of semiconductor devices.

It is still a further object of the invention to improve semiconductor yields.

It is a still further object of the invention to reduce the number of masks and simplify the processes required to fabricate a semiconductor device.

The above and other objects of the invention are accomplished with a high yield simple process to fabricate and manufacture semiconductor devices such as NAND type flash memory devices. In one aspect of the invention a NAND type flash memory device is fabricated using a process modified from processes used to fabricate NOR type memories. According to another aspect of the invention "a reverse field oxide process", which reverses the sequence in which the core and peripheral areas of a semiconductor device are initially formed, avoids an initial mask step required in conventional processes. This approach also allows the subsequent alignment for well implants.

In another aspect, the invention also eliminates an n-well mask and a thick gate transistor Vt implant mask when optimizing the formation of thick oxides for high voltage and thinner oxides for low voltage transistors to provide separate threshold voltage control.

In further steps, the process according to the invention eliminates the need for a poly silicon cap, the need for a high voltage implant mask and the need for a middle dope drain (MDD) implant mask, thereby saving two masks in this portion of the process.

In another aspect of the invention, a P+ contact implant mask is eliminated further reducing the cost.

BRIEF DESCRIPTION OF THE DRAWINGS

The above and other objects of the invention are accomplished in accordance with the process and structure disclosed herein and illustrated in the drawings wherein:

FIGS. 3-101 through 3-114 illustrate details of the correspondingly numbered step 101 through 114 in FIG. 3.

FIGS. 4-202 through 4-204, 4-208 through 4-211 and 4-214 illustrate details of distinctions between the process of FIG. 3 and the process of FIG. 4.

DETAILED DESCRIPTION OF THE PREFERRED EMBODIMENT

Figure 1A:
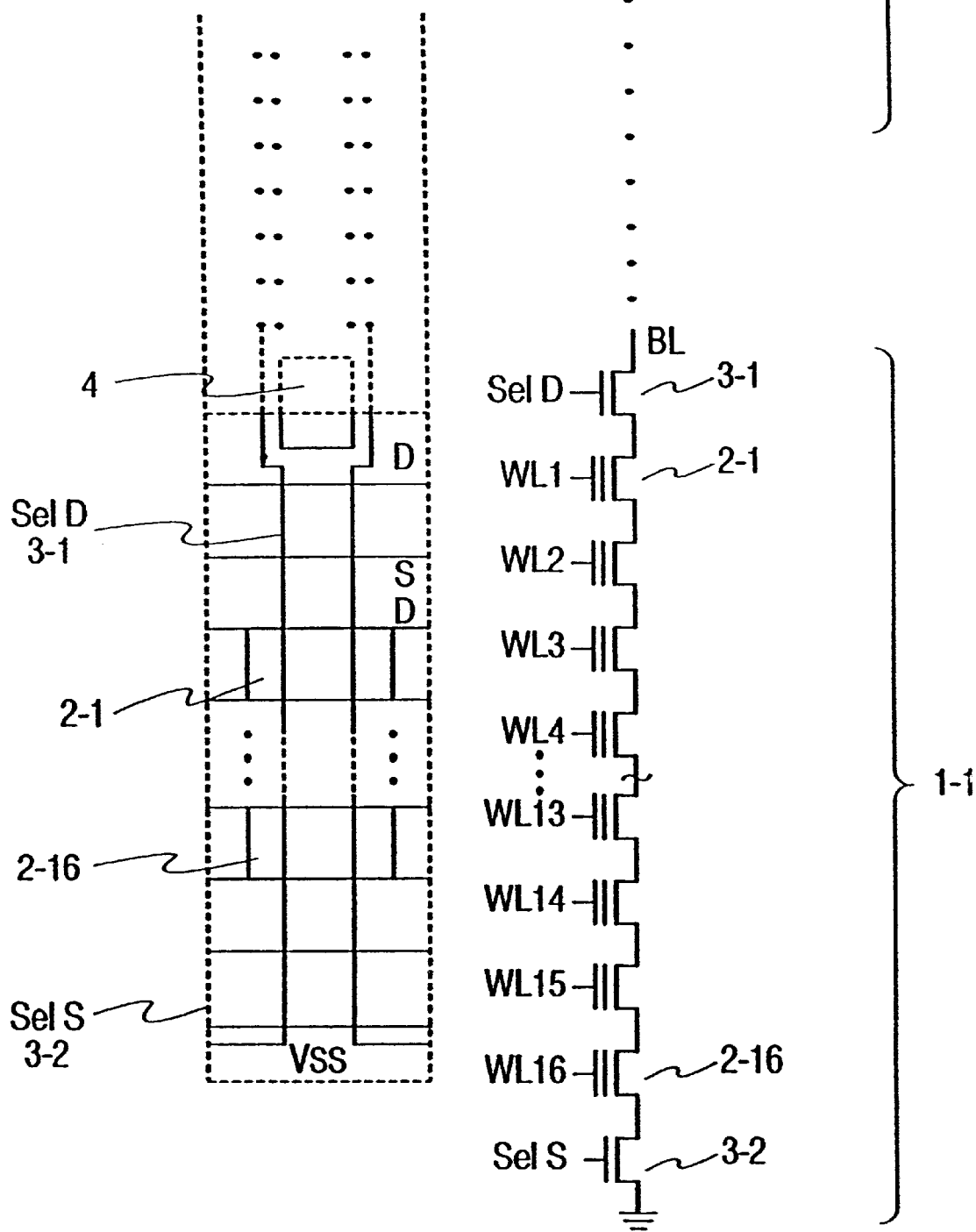
FIG. 1a generally illustrates the structure and schematic of a NAND flash memory core cell string.
Figure 1B:
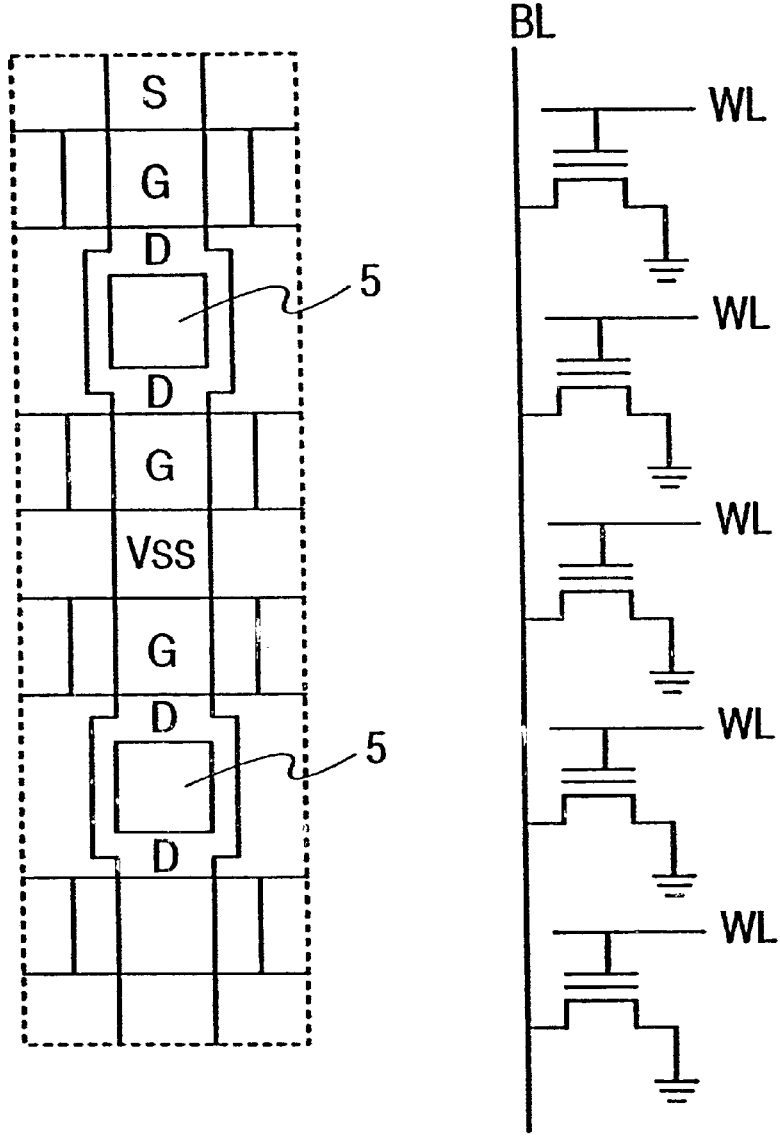
FIG. 1b generally illustrates the structure and schematic of a NOR flash memory structure core cell.

FIGS. 1a and 1b illustrate some of the differences between NAND and NOR flash memory structures. As is known in the art, such memory devices have a core region surrounded by a peripheral region. FIG. 1a shows a segment of the core region of a NAND flash memory structure and its schematic representation. In the NAND structure, shown generally at 1-1 in FIG. 1a, a plurality of floating gate transistors 2-1 through 2-16 are series connected, source to drain, to provide the memory storage transistors. The select drain (Sel D) and select source (Sel S) transistors, 3-1 and 3-2 are also in the core region in the NAND type device. As FIG. 1a shows, the Sel D and Sel S transistors, 3-1 and 3-2 respectively are not floating gate transistors. The Sel S transistor 3-2 has a common source, Vss. The NAND type device also has a mirror image of the floating gate and select gate transistor structure shown generally at 1-1 in FIG. 1a, as shown at 1-2. These mirror image structures 1-1 and 1-2 share one bit line contact 4. Thus, as shown in FIG. 1a, one bit line contact is use for a number of bits, for example, 32 bits. A plurality of such structures form the core array of the NAND type device.

FIG. 1b shows a segment of the physical structure of the core of a NOR type device and a corresponding schematic.

While only one bit line contact is required for the 32 bits shown in FIG. 1a in the NAND type structure, one contact 5 is required for two bits in the NOR configuration, as shown in FIG. 1b. Another difference between NAND and NOR type devices is that in the NOR type devices the entire core region can consist of floating gate transistors because the select transistors are in the peripheral region at the end of the core array.

One feature according to the invention is the modification of techniques previously used in fabricating NOR devices to fabricate NAND type devices. In this context, the fact that NAND devices have both floating gate and non-floating gate transistors in the core region is significant. As mentioned above, the core region in NAND type devices include both floating gate and non-floating gate transistors (the select transistors), while NOR type devices have only floating gate transistors in the core region. This structural difference in the transistor gates in the core region in the NAND type device requires shorting poly 1 (p1) and poly 2 (p2) layers to form the select transistors in the core region, as discussed further herein. Such a step is not required in fabricating NOR type devices.

Figure 2A:
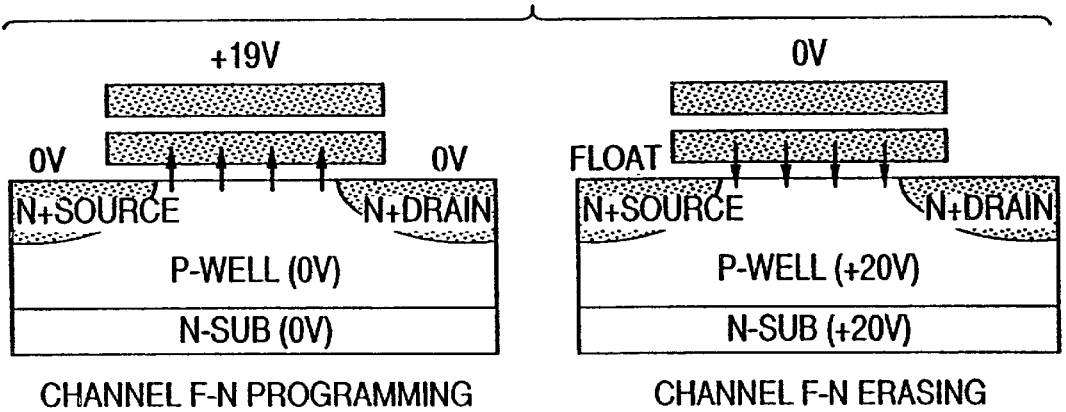
FIG. 2a generally illustrates the structure of floating gate transistors used in a NAND flash memory structure.
Figure 2B:
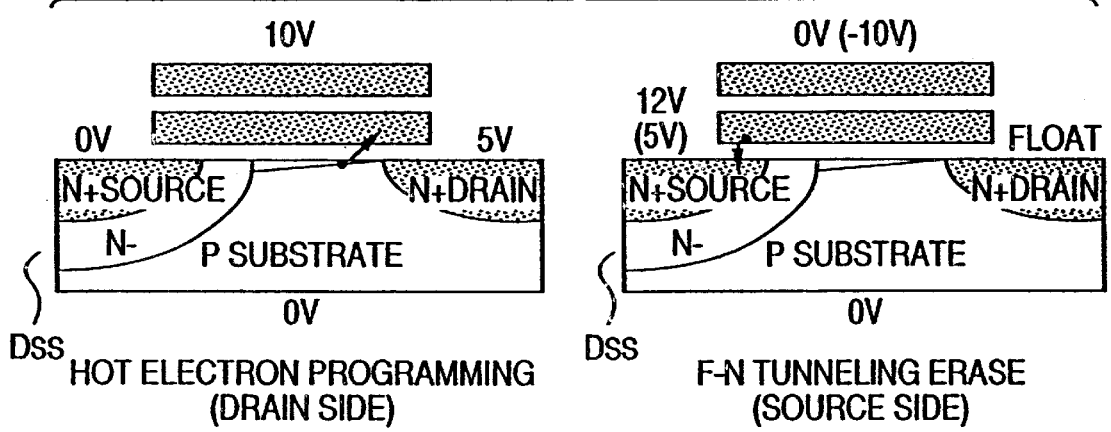
FIG. 2b generally illustrates the structure of floating gate transistors of a NOR flash memory structure.

FIG. 2a illustrates features of floating gate memory transistors fabricated for use in NAND type devices. FIG. 2b illustrates features of floating gate memory transistors fabricated for use in NOR type devices. Memory transistors used in NOR type devices are fabricated using a double diffused source (DDS) implant, which results in the asymmetric junction shown in FIG. 2b. The NAND type device in FIG. 2a has a symmetric junction because there is no double diffused source (DDS) source implant. Thus, the NAND configuration results in a shorter gate length.

In the NAND type device of FIG. 2a, the memory cell is inside the p-well. In the NOR type device in FIG. 2b, the memory cell is in the p substrate. NAND structures use higher program and erase voltages. For example, FIG. 2a illustrates the voltage required for channel Fowler-Nordheim (F-N) programming is about 19 volts, while the voltage required for channel F-N erasing is about 20 volts. FIG. 2b illustrates that NOR devices require about 10 volts for hot electron programming and about −10 volts for F-N tunneling erase. The higher voltages in the NAND type devices require better field isolation. The NAND flash memories typically require only one metal layer compared to three metal layers in NOR devices and simpler core junction structures, since NAND devices do not need asymmetric junctions. Therefore, NAND devices lend themselves to lower cost manufacturing processes.

Several other features distinguish NAND and NOR type flash memories. NAND flash memories are organized for serial read operations and therefore have a longer random access time. NAND configured flash memories are also more difficult to scale in the word line (WL) direction due to the high voltage (HV) operation. Finally, NAND flash memories tend to have smaller cell sizes.

Notwithstanding the differences between the NOR and NAND memory structures and the transistors used in them respectively, a process according to the invention modifies NOR flash memory fabrication techniques in order to fabricate NAND type flash memories. This allows fabricating NAND flash memory devices in facilities that fabricate NOR type flash memories without the need for redesigning the entire memory chip fabrication line. Such a process is shown in a first embodiment process illustrated in FIG. 3. A second embodiment process illustrated in FIG. 4 provides additional advantages by further simplifying the process and eliminating a number of masks.

Figures 3, 101A:
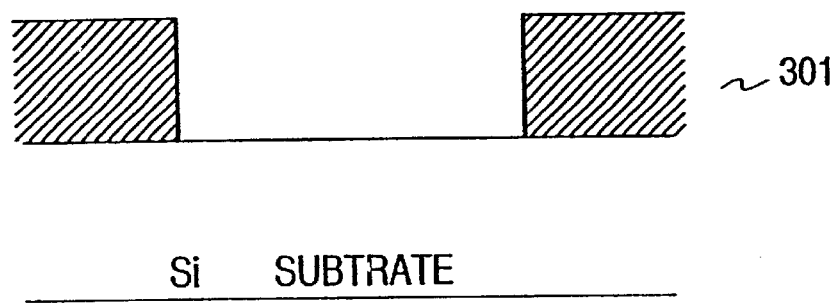
FIG. 3 illustrates a sequence of steps in a first NAND process flow for making a NAND type flash memory device according to the invention.
Figures 4, 203C:
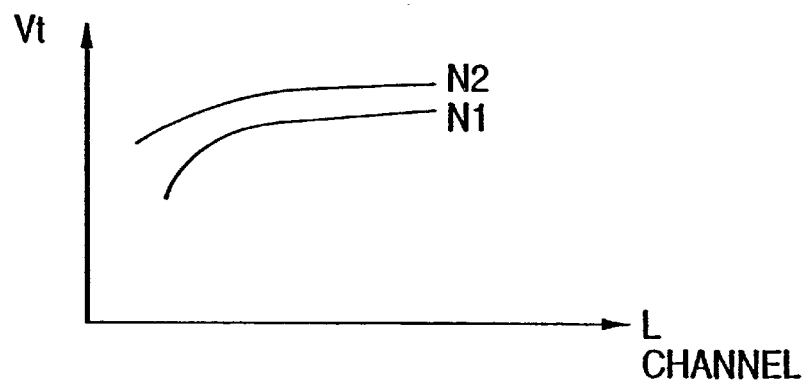
FIG. 4 illustrates a NAND semiconductor process flow according to the invention requiring fewer masks than the process shown in FIG. 3.

FIGS. 3 and 4 illustrate variations of a process flow according to the invention. The process flow of FIG. 4 is more efficient and cost effective, because it requires using fewer masks, thereby simplifying the process. The steps of the process of FIG. 3 are discussed first herein. The process flow in FIG. 4 is then discussed, pointing out the variations and distinctions from the process flow of FIG. 3.

FIG. 3 shows a first process flow according to the invention for forming a NAND semiconductor device. Similar processes used in the past for NOR devices differ from the process shown in FIG. 3. In particular, the process in FIG. 3 differs from such NOR processes in, inter alia, the formation of the select gate oxide and the tunnel oxide at step 106, the formation of the first and second gate oxides at steps 108 and 109, the high voltage mask and implant step at steps 111 and 112 and the contact formation at step 114.

Figures 3, 101B:
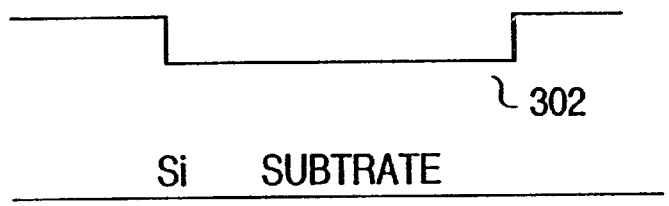

As illustrated in FIG. 3, the process for NAND device fabrication typically requires 27 masks. At step 101, a zero layer mask is placed on a silicon substrate and etching and cleaning are performed. The zero layer mask 301, e.g. a photo resist, in FIG. 3-101(a) is used to provide an alignment mark 302 for subsequent layers, as shown in FIG. 3-101(b). Typically, the alignment mask provides a distinct alignment pattern in the substrate.

Figures 3, 102A:
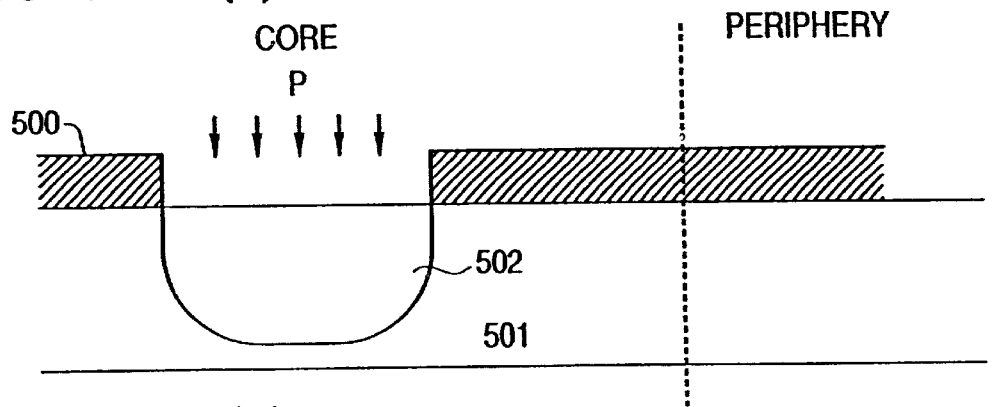

A second step in the process shown at step 102 of FIG. 3 is the formation of the deep n-, p- and n-well. This triple well mask step requires three masks. FIGS. 3-102(a) and 3-102(b) and 3-102(c) illustrate the steps performed in generating these wells. In FIG. 3-102(a) a mask 500 is placed over the silicon substrate 501 and n-type material, such as phosphorous (P) is implanted into the substrate using a conventional implant tool. A long thermal drive or diffusion process is then performed to obtain the deep n-well 502.

Figures 3, 102B:
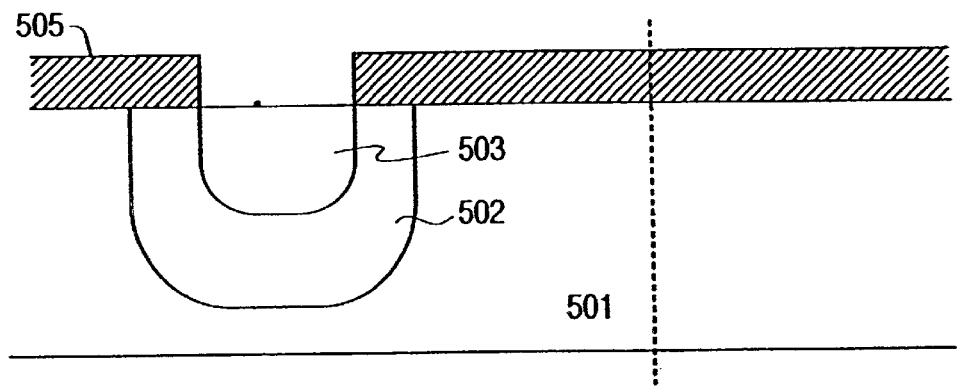
Figures 3, 102C:
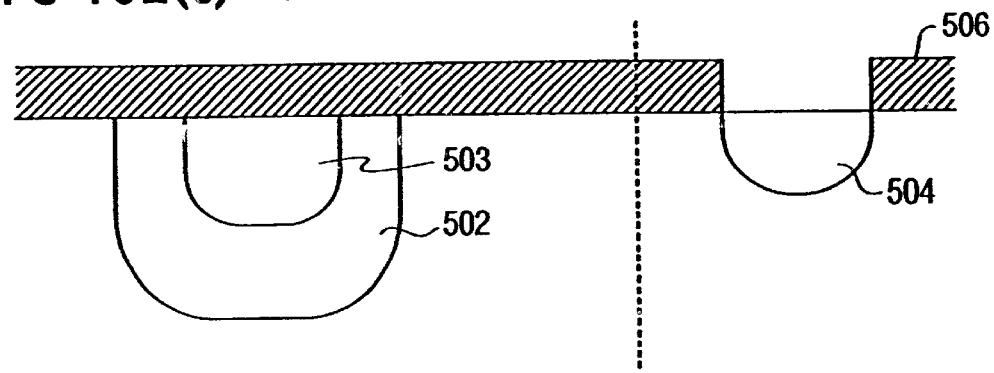

After the deep n-well 502 is formed, the p- and n-wells 503, 504 are formed. As shown in FIG. 3-102(b) and FIG. 3-102(c), two masks are required. The first mask 505 is used to implant boron into the deep well 502 to generate p-well 503. The second mask 506 is used to implant phosphorous into the p substrate 501 to generate an n-well 504 for a high performance p-channel transistor. The masks are removed and the resist cleaned away. A thermal drive or diffusion process can be used to form the p- and n-wells 503 and 504.

Figures 3, 103A:
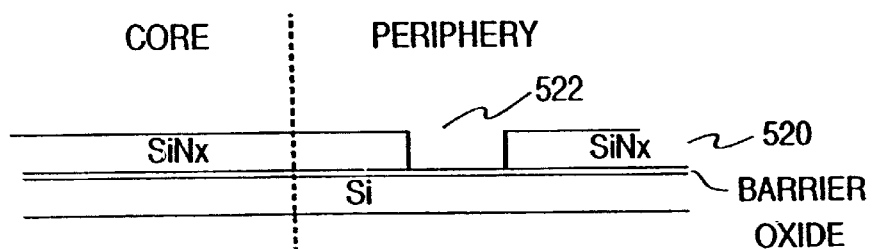
Figures 3, 103B:
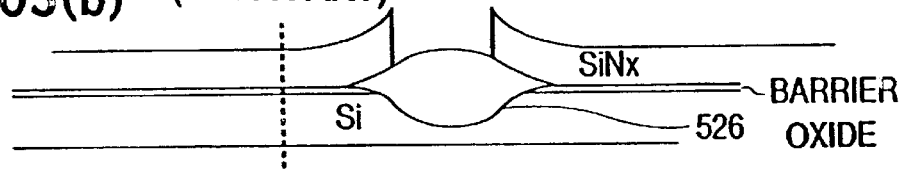
Figures 3, 104A:
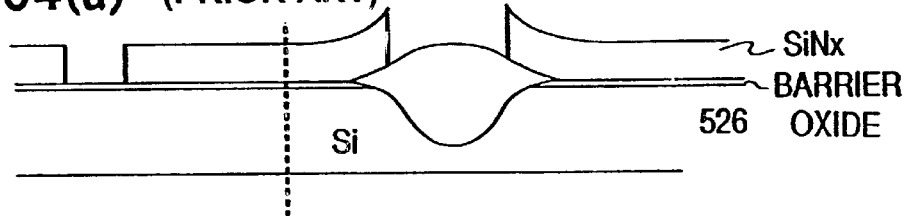
Figures 3, 104B:
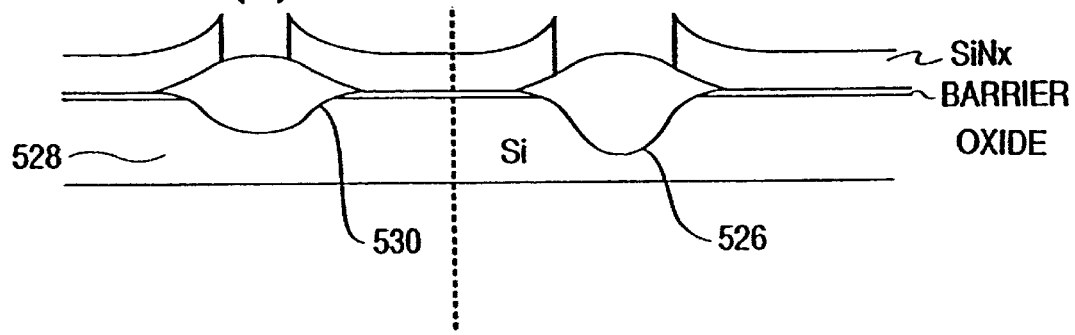

Step 103 is a periphery definition and field oxidation step. As shown in FIG. 3-103(a), in this step, a silicon nitride (SiNx) layer 520 is deposited and a peripheral source/drain mask (not shown) is used. An etch step is performed to form etched area 522 and a peripheral field oxide 526, e.g., 4000 Å thick, is grown as shown in FIG. 3-103(b). The field oxide can be formed using, for example, a conventional LOCOS technique In step 104 the core is defined using a similar process, with one source/drain mask and etching, as shown in FIG. 3-104 (a) and (b). A core field oxide is then formed. The core region is the region where memory storage takes place. As a result of the core region's high density, chip real estate is at a premium. In addition, the field isolation in the core region can be enhanced during a later process step (after poly 1 etch), by a so called channel stop implant step as shown in FIG. 3-107(d). The combined core field isolation scheme allows a thinner field oxide in the core. A thinner field oxide results in a smaller "bird's beak" region 530 as shown in FIG. 3-104(b), thereby allowing higher a circuit density. In addition, a thinner field oxide results in less curvature of the bird's beak. Less bird's beak curvature results in less physical stress on the tunnel oxide, thereby improving reliability and yield.

Step 105 is the peripheral field and core implants. These implants can be done in either order. Step 105 requires two masks, one being a n-channel field implant mask for field isolation in the peripheral region and the other being a core Vt implant mask. FIG. 3-105(a) illustrates the n-channel field implant mask 620 for the peripheral region. When mask 620 is in place, boron is implanted through the n-channel peripheral field oxide. This implant results in a heavy concentration of boron below the n-channel peripheral field oxide as shown at area 622 in FIG. 3-105(a). This concentration of boron results in isolating transistors from each other. Boron implanted at areas shown as 624 and 626 is very deep so that it has minimum effect on n-channel transistor performance.

FIG. 3-105(b) illustrates the core Vt implant mask 630. Boron is implanted in this portion of step 105, as shown in FIG. 3-105(b).

In step 106 a select gate oxide and a tunnel oxide for the memory cells are formed. As previously discussed, NAND type flash memory devices are distinguished from NOR type devices because the NAND devices have both non-floating gate select transistors and floating gate memory transistors in the core region. Step 106 accommodates this feature of NAND type devices and requires one tunnel oxide mask and etch. FIGS. 3-106(a) through 3-106(c) illustrate the formation of the select gate oxide and tunnel oxide in the core region. A 150 angstrom thick select gate oxide layer 701 is grown over a p-well 702 in the core area using conventional techniques. As shown in FIG. 3-106(a), a select oxide mask 703 (TNOM) is then placed over the select gate area. The select gate oxide 701 for the core memory cell region is then etched off and the mask 703 is removed. As shown at 705 in FIG. 3-106(c), a 95 angstrom thick oxide is then grown over the core memory cell and select transistor areas, resulting in an oxide layer (Gox) of about 180 angstroms over the select gate and a 95 angstrom tunnel oxide (Tox) over the floating gate transistor memory cells because the oxides grow at different rates. A first polysilicon or poly 1 (p1) layer shown in FIG. 3-107(a) is then placed over the core and peripheral regions.

Step 107 requires two masks. The first is a poly 1 mask followed by an etch. A channel stop implant step is then performed and an ONO deposition takes place followed by a mask and etch. The figure shows a tunnel oxide layer Tox, indicating a floating gate memory cell. FIGS. 3-107(a)–3-107(g) illustrate the process of step 107. FIG. 3-107(a), shows the core and peripheral areas at the end of step 106 with a p1 layer deposited. In FIG. 3-107(b), a p1 mask is added for use as an etch mask. After masking, an etch is performed resulting in the structure of FIG. 3-107(c). A channel stop implant as shown at FIG. 3-107(d) into the silicon substrate in the core field oxide (CFOX) area is then carried out to create channel stop 707 before the resist (mask) is removed in order to isolate the bit lines in the core region, as mentioned earlier. FIG. 3-107(e) illustrates the structure after ONO deposition, followed by a masking step in which the ONO over the core is masked with ONO mask 709. (As discussed further herein, for the process illustrated in FIG. 4, which is different from the process illustrated in FIG. 3, the ONO mask over the core has openings at the p-well taps as shown in FIG. 4-211(c)). An etch is then performed resulting in the structure of FIG. 3-107(f) in which the periphery region is exposed to the field oxide layer. FIG. 3-107(g) is a top view showing poly 2 word lines discussed further herein and wherein the cross hatched region represents the floating gate.

Figures 3, 108A:
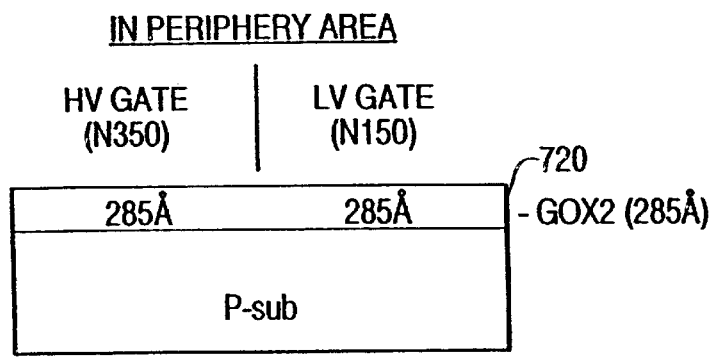
Figures 3, 108B:
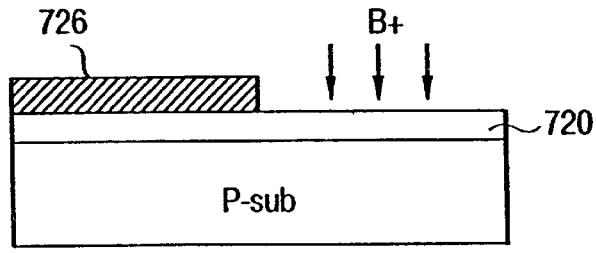
Figures 3, 108C:
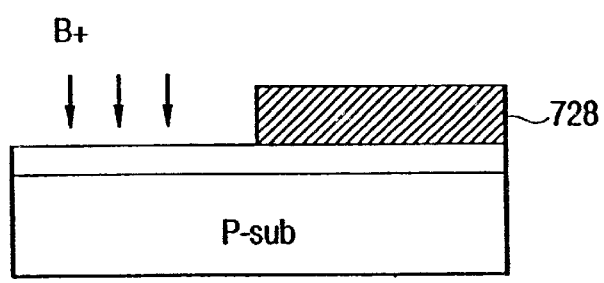
Figures 3, 108D:
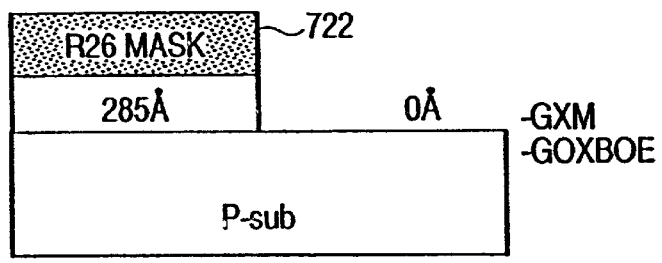

Step 108 is the formation of the first gate oxide and the high voltage and low voltage implants in the peripheral region. FIGS. 3-108(a) through 3-108(d) illustrate the thick and thin gate oxide formation and high and low voltage transistor implants over the peripheral region. Using a similar approach to that of FIG. 3-106(a), a 285 angstrom first gate oxide 720 is grown. As noted in FIG. 3 step 108 requires three masks. As shown in FIG. 3-108(b), after growing the first gate oxide, a low voltage threshold voltage implant mask 726 is used to direct the implanting of impurities, such as boron, into active areas to adjust threshold voltage for low voltage transistors. A separate mask 728 is used for a threshold voltage implant for the high voltage transistors, as shown in FIG. 3-108(c).

Figures 3, 109A:
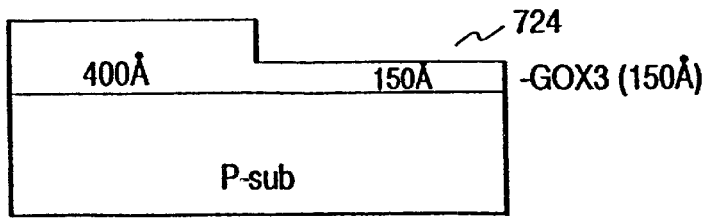

In step 109, a second gate oxide is formed before depositing the second polysilicon (p2) and SiON/polycap. The formation of the second gate oxide is shown in FIG. 3-109(a). A gate oxide (Gox) mask 722 is applied. This mask is used to etch away the oxide in the low voltage transistor regions and then removed. The second gate oxide is then grown to achieve both the high and low voltage gate oxides. As shown in FIG. 3-108(d), the oxide in the high voltage regions is masked with mask 722 and the oxide in the low voltage transistor areas etched off. In step 109, a second gate oxide layer 724 is then grown over both the high and low voltage transistors at different rates, resulting in thicker and thinner oxides for the high voltage and low voltage transistors. FIG. 3-109(a) illustrates the result of growing the second gate oxide following removal of mask 722.

Figures 3, 109B:
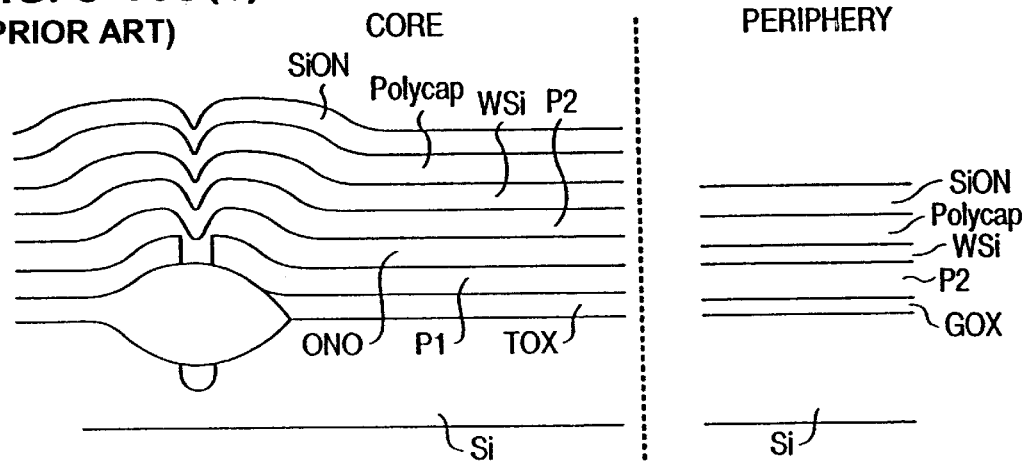

In step 109, after the second gate oxide and poly 2 layers are formed, a tungsten silicide layer (WSi) is then deposited. A poly cap is formed and a SiON compound film deposition takes place, resulting in the structure in FIG. 3-109(b).

Figures 3, 110A:
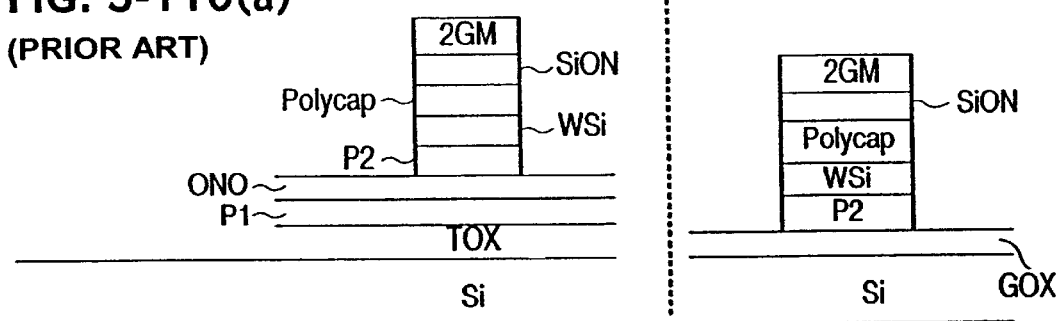
Figures 3, 110B:
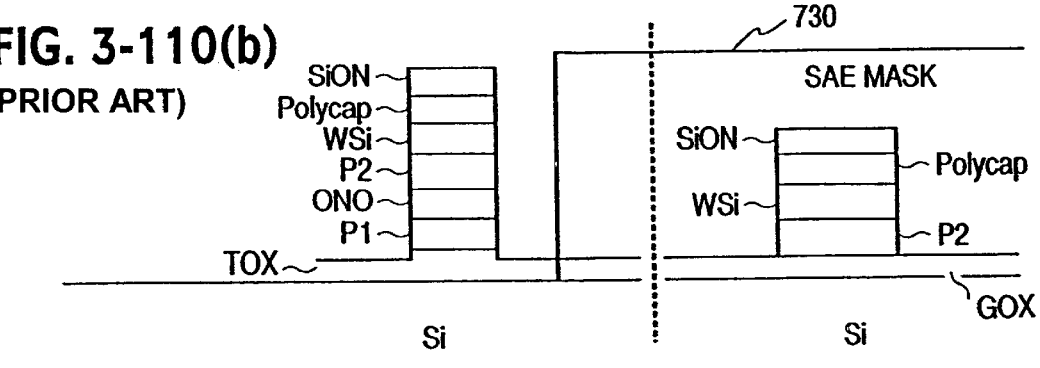

Step 110 utilizes two masks and is the peripheral and core gate definition step. As shown in FIG. 3-110(a), this step requires placing a second gate mask (2GM) on both the core and peripheral gate regions. This is followed by an etch resulting in the structure shown in FIG. 3-110(a). Then a self-align etch (SAE) mask 730 having an opening at the core area only is deposited and is followed by an etch. During the self align etch, the ONO and the and p1 in the core areas are removed as shown in FIG. 3-110(b). In the core region, the SiON/Wsi/p2 stack is used as a self aligned physical mask to define a core transistor gate, resulting in the structure shown in FIG. 3-110(b).

Figures 3, 111A:
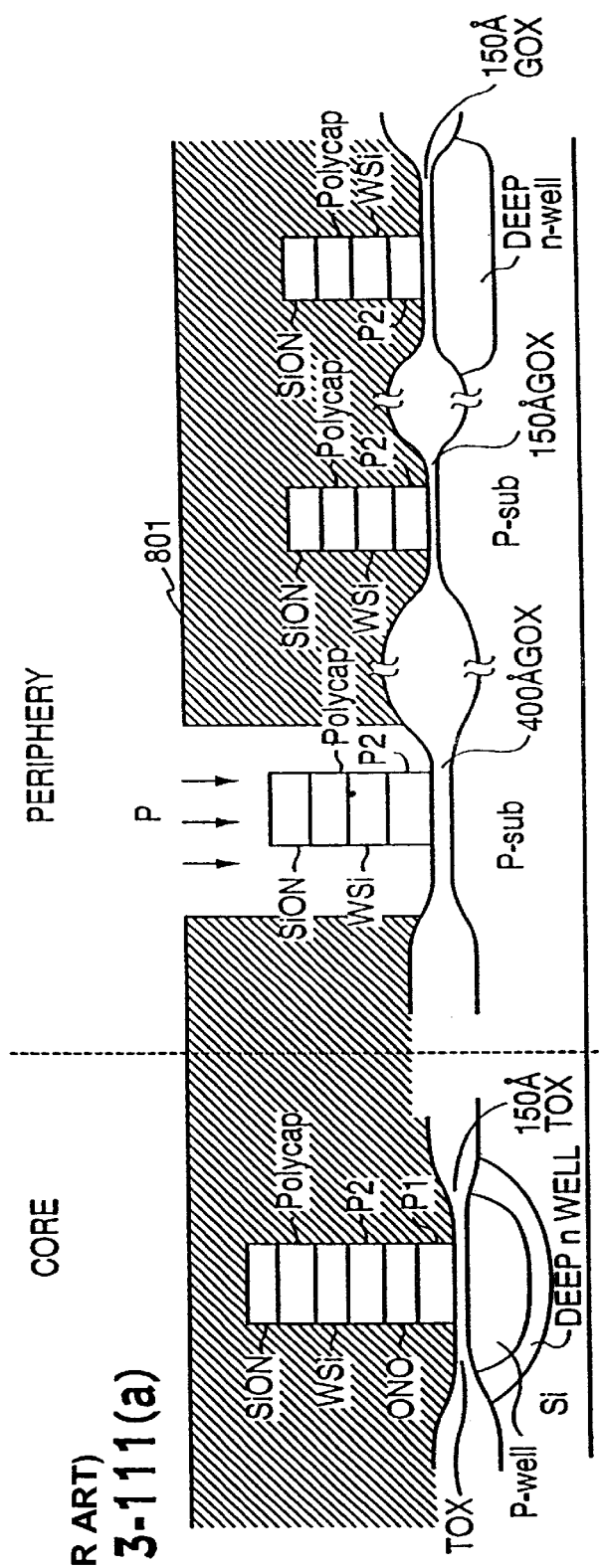
Figures 3, 111B:
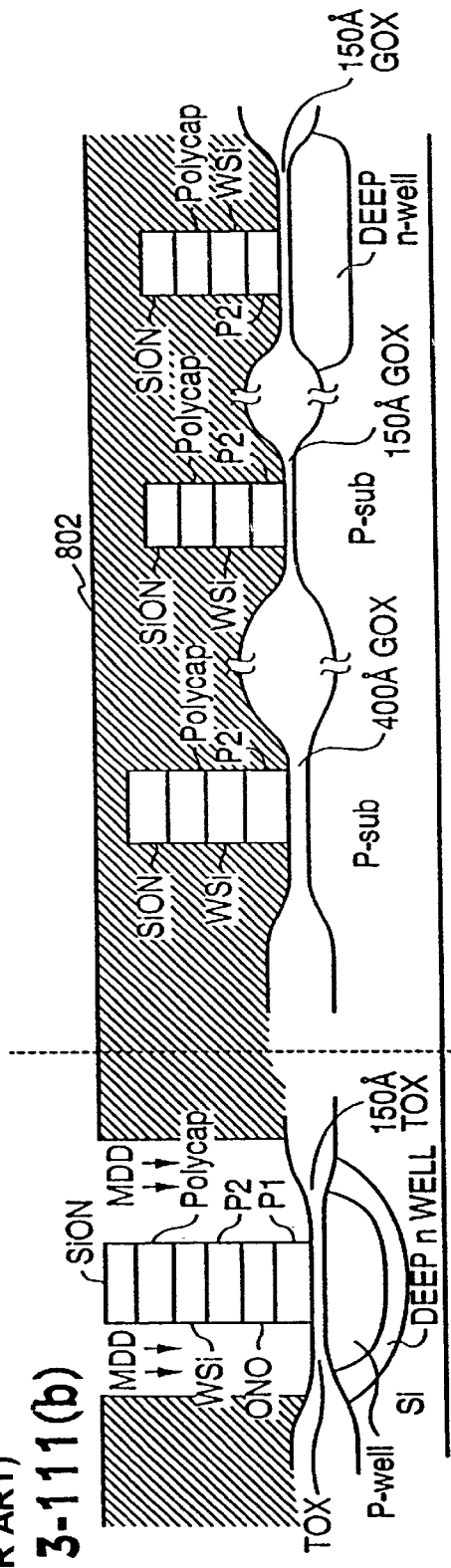

As stated in FIG. 3, in step 111 four masks are required. FIGS. 3-111(a) through 3-111(d) illustrate the process which takes place at step 111 in FIG. 3. FIG. 3-111(a) shows the first mask 801, which is a high voltage implant mask to allow for implanting impurities, such as phosphor into the high voltage transistors in the peripheral region. This is followed by the by depositing a middle dope drain (MDD) implant mask 802 for core source/drain implant, as shown in FIG. 3-111(b). The MDD mask 802 covers the p-well tap area in the core to prevent the n-type MDD implant into the p-well tap area. After the MDD implant, a thermal drive is performed in a furnace. Then, a low voltage n lower dope drain (nLDD) implant mask 803 is used for the n-channel implant in the peripheral region, as shown in FIG. 3-111(c). Finally, a pLDD implant mask 804 is used for the lower dope drain p channel implant of boron floride (BF2), as shown in FIG. 3-111(d).

Figures 3, 112:
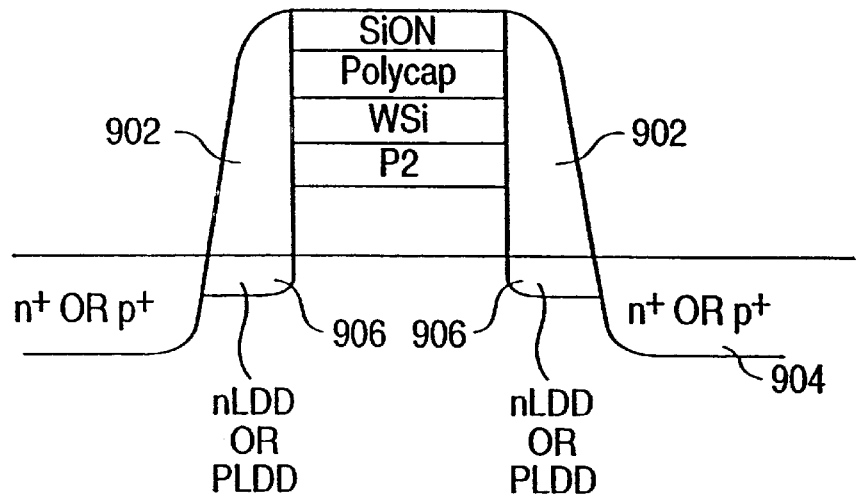

In step 112 in FIG. 3, two masks are required. After spacer deposition and spacer etch, these masks are used for the n+ and p+ source/drain implants to form source and drains for the low voltage n- and p-channel transistors. As shown in FIG. 3-112 a spacer oxide layer is deposited using conventional techniques. Following the deposition, the spacer etch is performed to form the configuration at 902 shown in FIG. 3-112. This is followed by implanting the source and drain n+ or p+ impurities with the n+ or p+ implant masks (not shown) to form peripheral transistor source and drains, as shown at 904 in FIG. 3-112. The nLDD or pLDD implants are shown at 906 in FIG. 3-112.

Figures 3, 113:
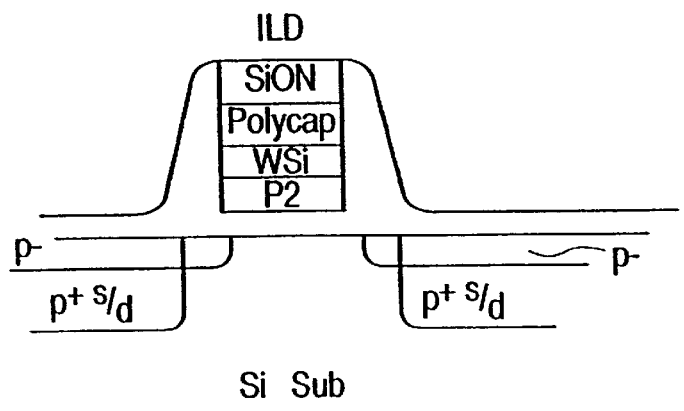

Step 113 is the interlayer dielectric (ILD) deposition and planazation step which requires no masks. As is known in the art, the ILD, which may be a stack of high temperature oxide and boron phosphor TOES oxide, is deposited on top of the device and polished to be flat, as shown in FIG. 3-113.

Figures 3, 114:
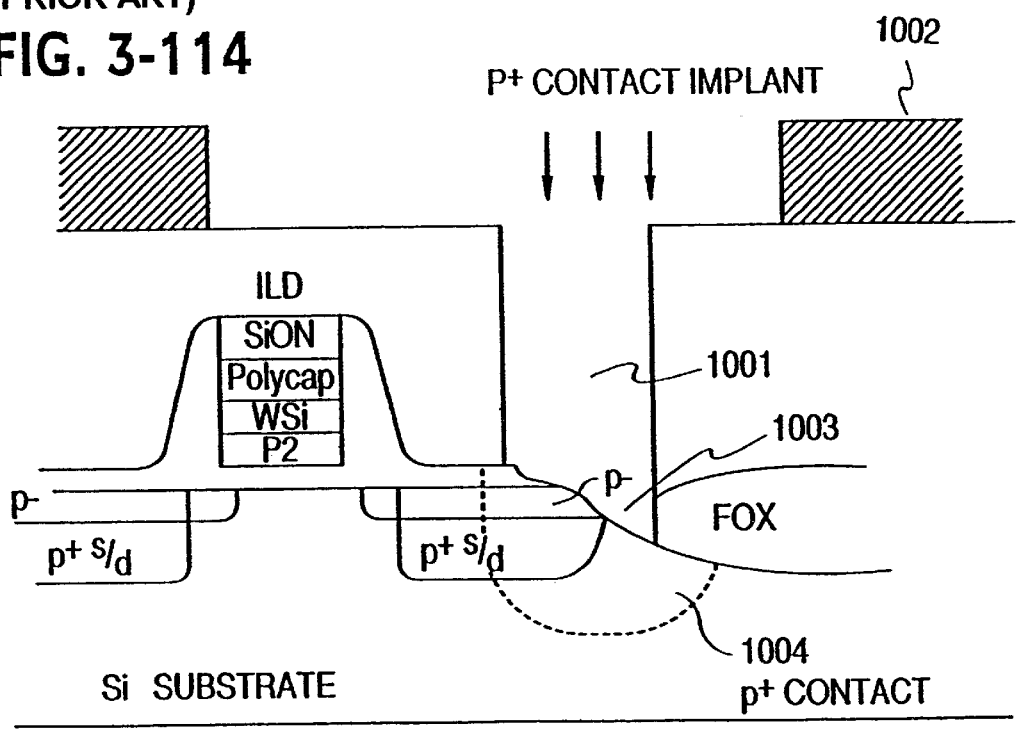

Step 114 in FIG. 3 relates to forming the contact plug and requires three masks. One is a contact mask (not shown) for etching through the ILD layer at the contact location 1001 in FIG. 3-114. The second and third mask are used as n+ and p+ contact implant masks, which are used in the following n+ and p+ contact implant step. As an example, only the p+ contact implant mask 1002 is shown in FIG. 3-114. The p+ contact is used to prevent junction leakage. Junction leakage can occur due to misalignment of the contact hole to the p+ source/drain layer, as shown at 1003. The p+ contact implant 1004 helps prevent junction leakage resulting from such misalignment. In addition, junction leakage can also result from silicon gouging. The p+ contact implants also help to prevent junction leakage resulting from silicon gouging, for example when the etch for the contact extrudes into the silicon substrate.

After contact implants are completed, a tungsten stack is deposited and polished to form the tungsten plug (w-plug) which provides contact to the substrate, poly 1 and poly 2 and n- and p-layers. As discussed further herein, the p+ contact mask and implant step can be eliminated in the method shown in FIG. 4.

Step 115 is a metal interconnect formation step which requires one mask for an etching and is conventional.

Step 116, which is the topside layer deposition, requires one pad mask followed by etching and an ultraviolet erase step, as is known in the art.

The NAND process flow as shown in FIG. 3 requires a total of 27 masks. FIG. 4 illustrates another semiconductor NAND process flow according to the invention. As illustrated, the process flow according to the invention in FIG. 4 requires only 21 masks, and simplifies the fabrication process resulting in a significant savings in the fabrication of such a device.

A first aspect of the process in FIG. 4 that differs from the approach in FIG. 3 is the "reverse field oxide" approach to save a mask step at the outset. While the process in steps 101–104 of FIG. 3 began with forming a zero layer mask and peripheral definition, the approach according to FIG. 4 skips the zero layer mask etch and cleaning steps and at step 202 begins with the core definition step. This allows eliminating the zero layer mask because the core field oxide provides alignment marks for subsequent layers.

Figures 4, 202A:
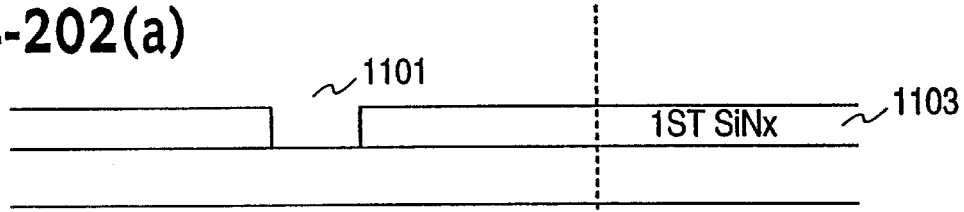
Figures 4, 202B:
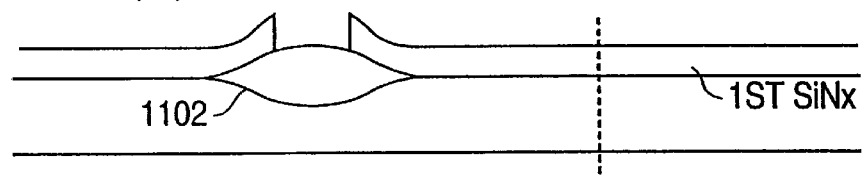

FIGS. 4-202(*a*) and 4-202(*b*) illustrate the differences in these steps in more detail. In FIGS. 3-101 through 3-104 a mask is used, silicon nitride (SiNX) 520 is deposited, the etch is performed at 522 and the mask removed. The first field oxide 526 of about 3000 angstroms is grown in the periphery. Another mask is used to define the core source/drain regions. Then, the core field oxide 528 of about 2500 Å is grown and that mask removed, resulting in a periphery oxide of 4000 Å.

Figures 4, 204A:
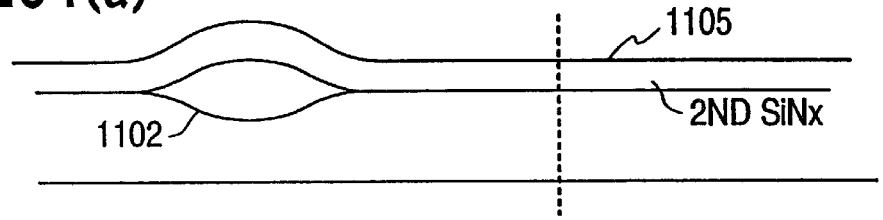
Figures 4, 204B:
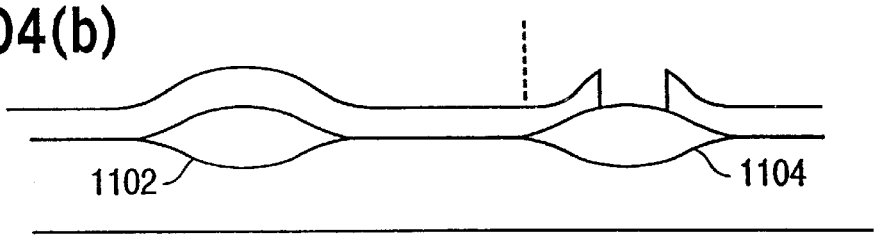

In FIG. 4-202(*a*) a core source/drain mask is used to define the core source/drain regions at 1101. As shown in FIG. 4-202(*b*) a 1700–2500 Å core field oxide 1102 is grown using, for example, techniques as previously discussed herein. Nitride layer 1103 is removed and a new nitride layer 1105 is deposited masked and followed by an etch to define peripheral source/drain regions, as shown in FIG. 4-204(*a*), to avoid growing additional core oxide. The peripheral oxide is then grown to about 4000 Å as shown at FIG. 4-204(*b*). Thus, the process in FIG. 4 requires additional nitride but only the same number of masks to form the core and peripheral field isolation.

An added advantage of the "reverse field oxide" process according to the invention is the improved oxide recess at the interface regions between the peripheral and core areas. Forming the peripheral region first results in severe oxide recession. Such oxide recession can result in the formation of stringers later in the manufacturing process, which can cause process defects and low yields. The risk of punching through the oxide layer due to oxide recession also leads to electrical shorts. Furthermore, implanting phosphor through 4,000–5,000 angstroms of peripheral field oxide to form a deep n-well requires a significant high energy implant, which increases manufacturing difficulty and cost. These risks are significantly reduced by forming the core field oxide before the peripheral one.

In step 203 of FIG. 4 a deep n- or p-well is formed, as shown in FIG. 2-403(*a*). Unlike step 102 in the process of FIG. 3, which is a triple well construction requiring three masks, step 203 is a dual well mask and implant step that requires only two masks. According to the process of FIG. 4, the n-well mask is eliminated. As a result, the n-well (504 in the FIG. 3-102(*c*)) for the high performance p-channel transistor is being replaced by the deep n-well p channel transistor (a well masked and formed simultaneously with well 502, resulting in two deep wells). This results in a structure with deep n wells 1110 and 1112, as shown in FIG. 2-403(*a*) after the first mask 1114 is applied. Mask 1114 is removed and mask 1116 applied to create p-well 1118, using techniques as previously discussed with respect to FIG. 3. This is possible because the channel doping concentration of the deep n-well p channel device is increased because of the enhancement dopant loss during the optimized dual gate process, which occurs later in the process at steps 208 and 209 of FIG. 4.

Figures 4, 203A:
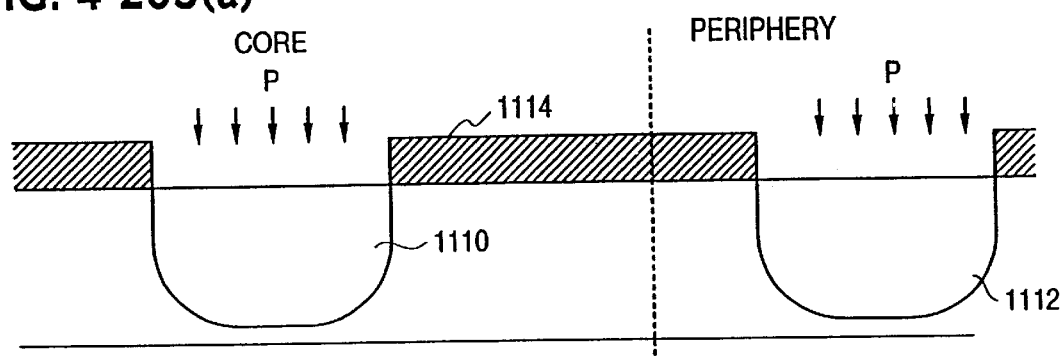
Figures 4, 203B:
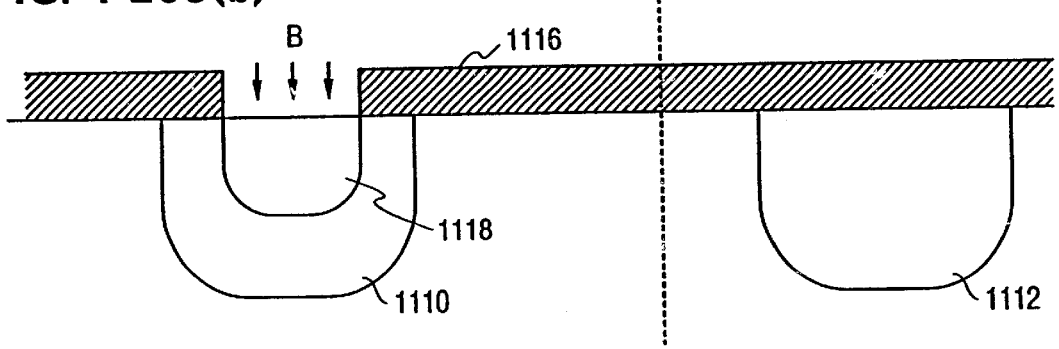
Figures 4, 209A:
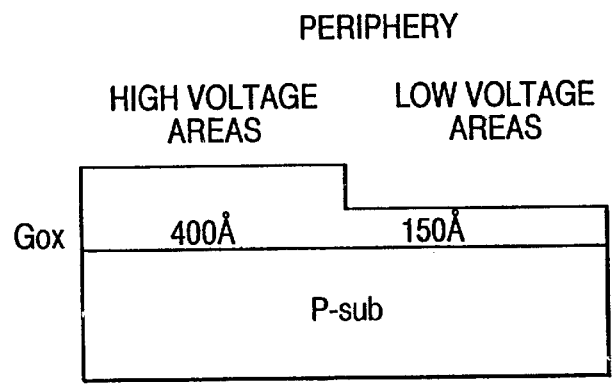
Figures 4, 209B:
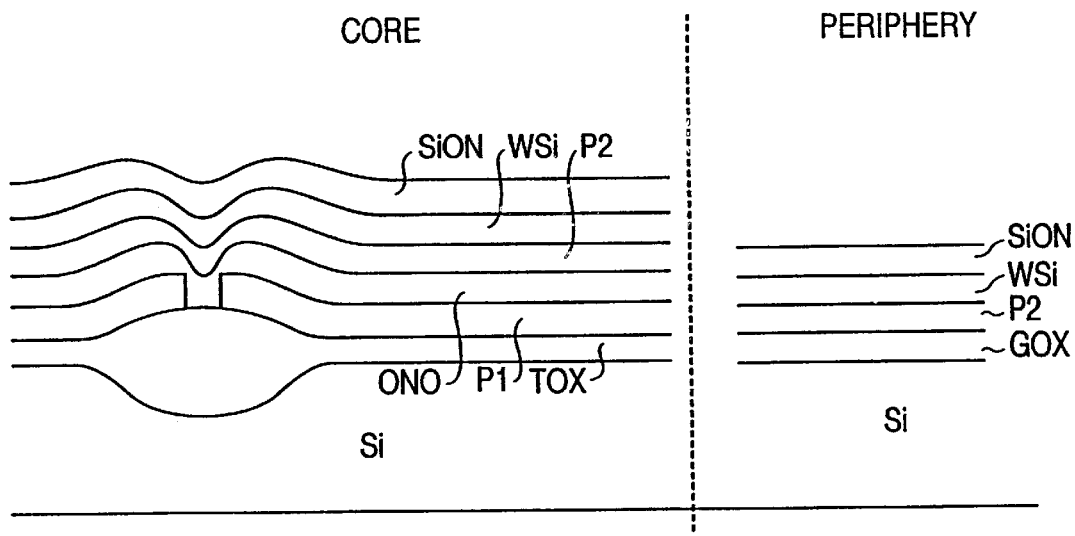
Figures 4, 209C:
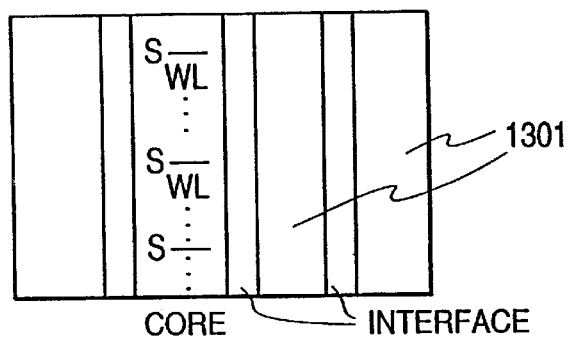
Figures 4, 209D:
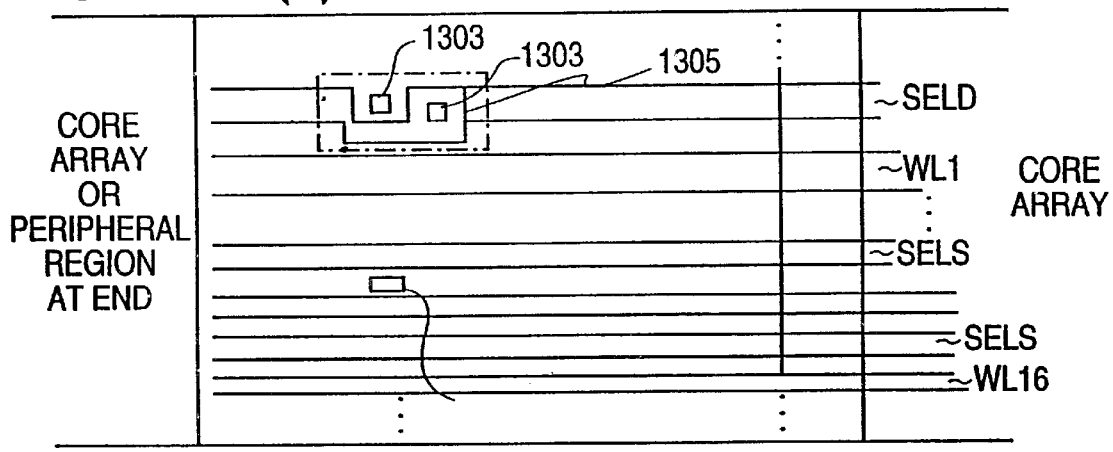
Figures 4, 209E:
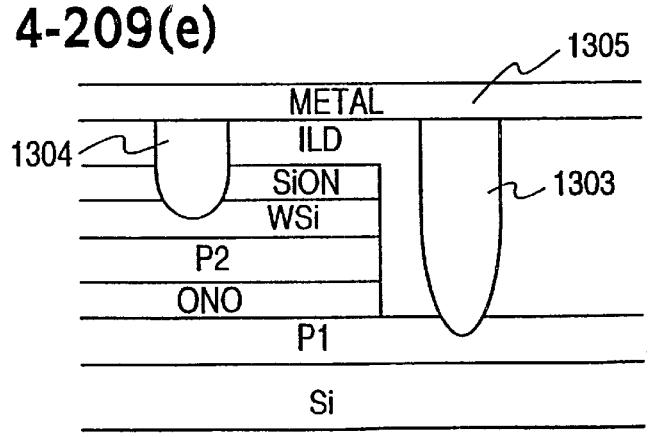
Figures 4, 210A:
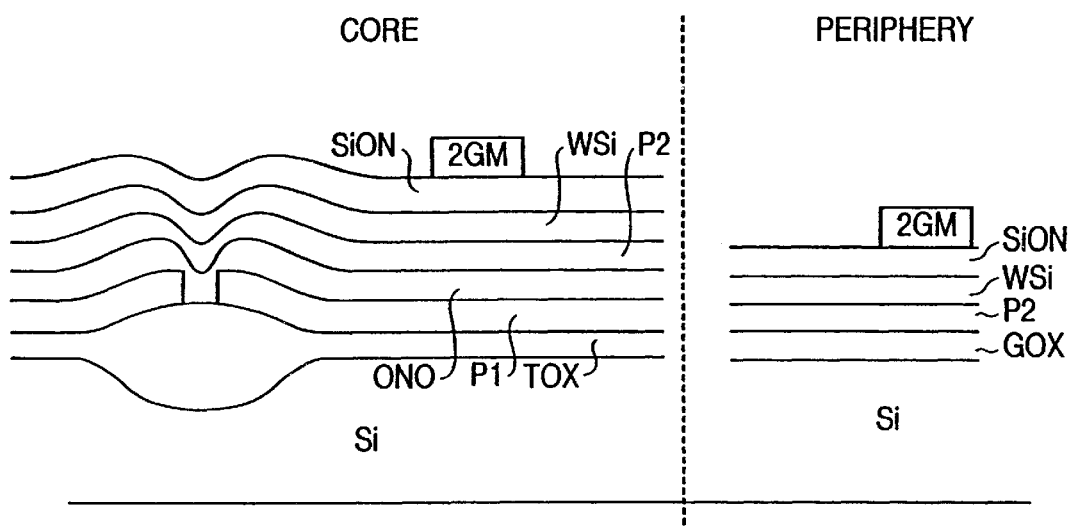
Figures 4, 210B:
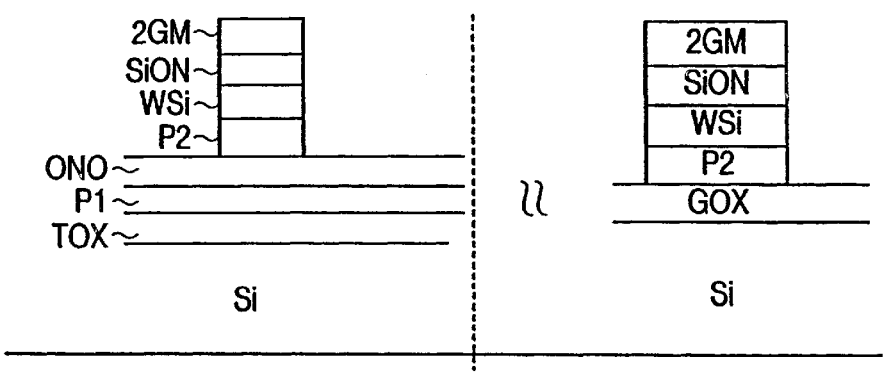
Figures 4, 210C:
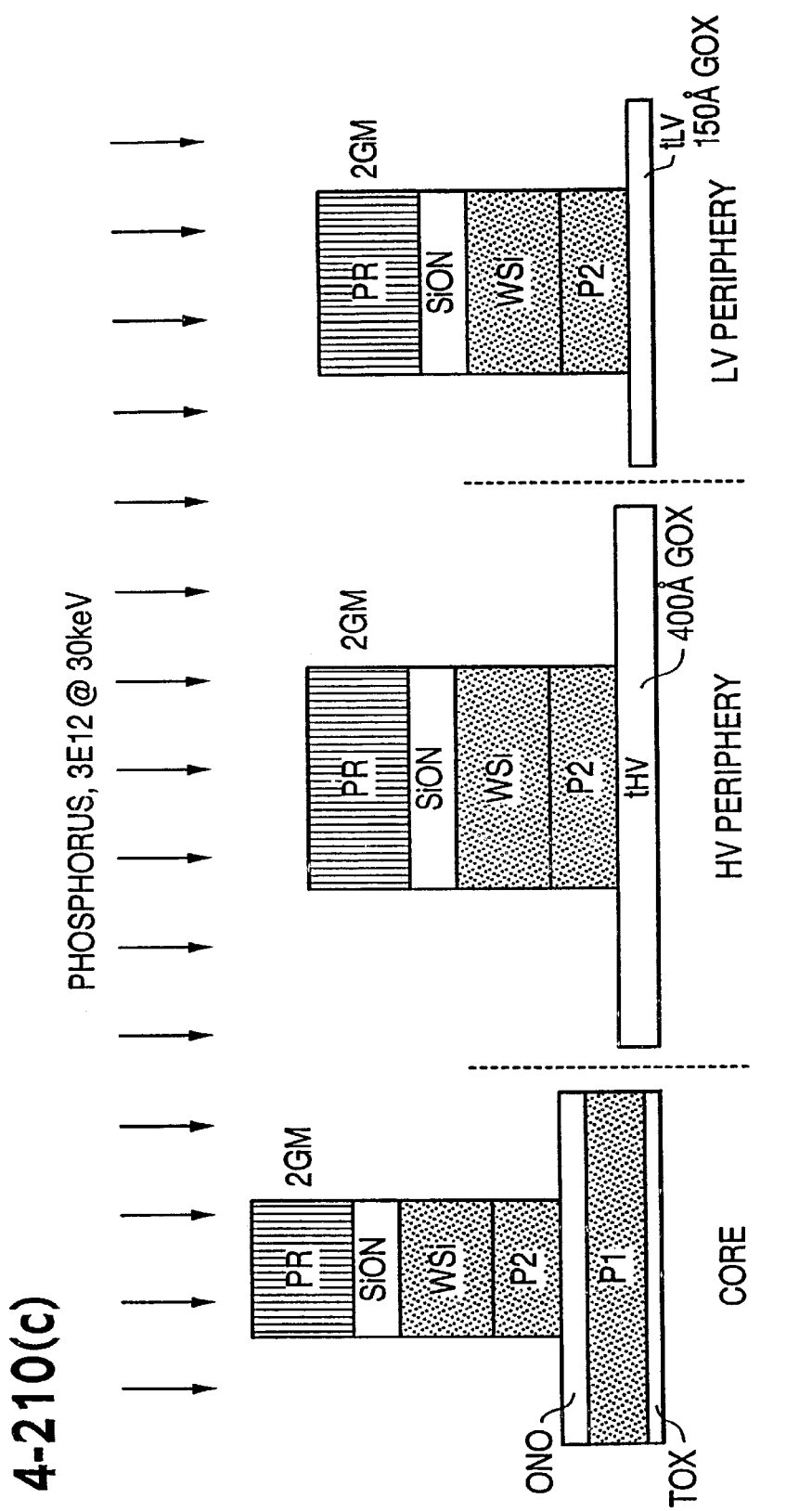
Figures 4, 210D:
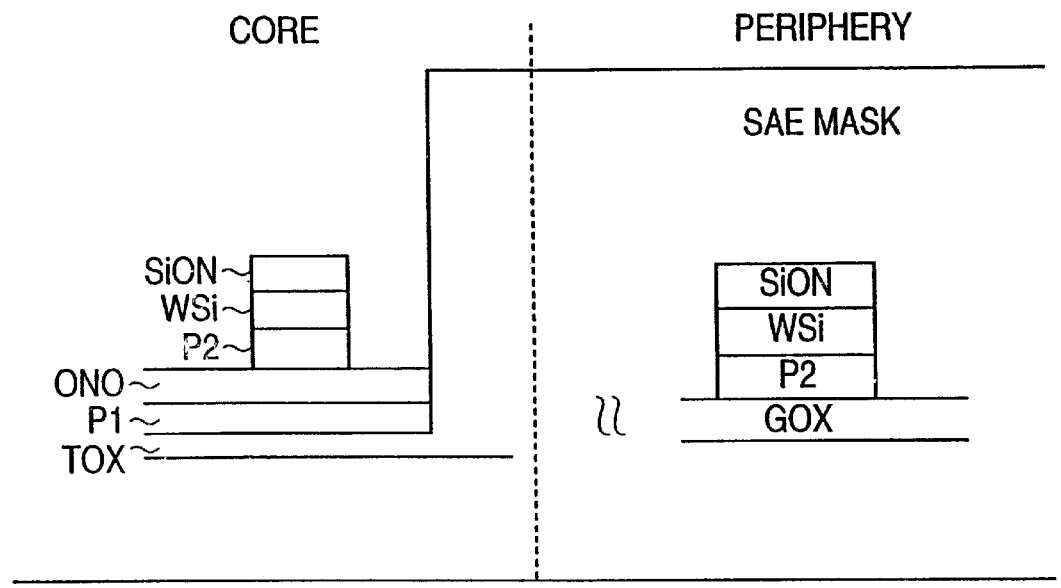

FIG. 4-203(*c*) compares the threshold voltage against channel length as a function of channel doping concentrations in the deep n-well, where the concentration N2 of p type material exceeds the concentration N1 of p type material. The higher concentration results in a higher threshold voltage Vt for the minimum channel length, due to reduced short channel effect and hence threshold voltage roll off. An added advantage is that the p-channel Vt is much closer to the n-channel Vt than is achieved with the process of FIG. 3 previously discussed herein, which allows better product performance.

Step 204, as previously discussed and shown in FIGS. 4-204(*a*) and 4-204(*b*), is the peripheral definition and field oxidation step. In step 204 one peripheral source/drain mask is used. Etching is performed and a 4000–5000 Å peripheral field oxide is grown using techniques previously discussed herein.

Like step 105 in the process of FIG. 3, step 205 in the process of FIG. 4, is the injection of the peripheral field and core implants. This step requires two masks. One is an n-channel field mask. The other mask is a core Vt mask, as previously discussed with respect to FIG. 3. Step 206 is similar to the approach previously discussed for step 106. One mask is required. A select gate oxide is formed and a tunnel oxide mask is used followed by an etch. A tunnel oxide is formed and a poly 1 layer is deposited as previously discussed.

Step 207, in the process of FIG. 4 like the process in step 107 of the process in FIG. 3, requires two masks. First a poly 1 mask is used. After etching, the channel stop implant is performed and a ONO layer is deposited. An ONO mask is laid and an etch performed. An important distinction between the process of FIG. 3 and that of FIG. 4 is that the ONO mask used in the process of FIG. 4 has openings at the p-well taps in the core interface as shown in FIG. 4-211(*c*), discussed further herein, so that the MDD mask can be saved in the latter part of the process of FIG. 4.

Steps 208 and 209 differ from steps 108 and 109 in the process of FIG. 3. The process in steps 108 and 109 requires three masks. However, steps 208 and 209 require only two masks, as discussed further below.

As discussed previously herein, NAND flash memory operation requires high voltage. Thus two types of transistors, low and high voltage threshold transistors, are required. The high voltage transistors require a thick gate oxide while the low voltage transistors use a thin gate oxide. Therefore dual gate oxides are required. According to this aspect of the invention of the process in steps 208 and 209 of FIG. 4, as shown in FIG. 4-208(*a*) and 4-208(*b*), a first mask 1201 is used so that in the periphery area a 285 angstrom thick gate oxide 1202 is grown on both the high voltage and low voltage transistor areas as well as on top of the ONO film in the core region. This produces about one half the oxide thickness of the required for the high voltage gate. A mask 1203 is laid to cover the areas for the growth of the thick oxide. This is followed by etching away of the area for the thin oxide. The rest of the oxide is then grown. This results in two thicknesses of oxide, with the thicker oxide over the high voltage transistor areas and the thinner oxide over the low voltage transistor areas.

The Vt implantation process in step 208 of the FIG. 4 process also differs from that of step 108 for the process in FIG. 3. Ordinarily, one implants boron to adjust the threshold. In the process flow of FIG. 3, two masks are required for two individual implants, one for the high voltage threshold and the other for the low voltage threshold. However, according to the process flow of FIG. 4, half the dose of boron for the low voltage transistor is provided through the first Vt implant mask. As previously noted, after the 285 angstrom thick gate oxide is applied, a mask 1203 is used so that the area for the thin gate can be etched away. Before this oxide etch, another half dose of boron for the low voltage transistors is applied to the thin gate areas. As a result, the thick gate area sees only the first half of the boron implant, while the thin gate areas receive the entire dose. As shown in FIGS. 4-208(*a*) and 4-208(*b*), this approach eliminates a mask, thereby simplifying the process and reducing the cost. The oxide 1204 over the low voltage area in FIG. 4-208(*b*) is then etched off, so that a second gate oxide can be grown in step 209.

In step 209 of the process of FIG. 4, the mask 1203 in FIG. 4-208(*b*) is removed and a second gate oxide is grown resulting in an oxide thickness of 150 angstroms in the low voltage area and a thickness of 400 angstroms in the high voltage area, as shown in FIG. 4-209(*a*). In step 209, a second poly silicon layer is formed, as shown in FIG. 4-209(*b*). This is covered with tungsten silicide. At this point the structure includes the tunnel oxide, the floating p1 gate, or storage layer, covered by a ONO dielectric layer, covered by a control gate or second poly silicon layer covered by silicide, as shown in FIG. 4-209(*b*). In step 109 of the NAND process flow of FIG. 3, a polysilicon cap was placed over the silicide layer to protect it. According to the process flow of FIG. 4, however, the polysilicon cap is skipped by using the SiON as the protection layer and optimizing the SAE etch process, as discussed further herein.

A reason for eliminating the polysilicon cap in the process flow of FIG. 4 is to facilitate elimination of the floating gate in the select transistor. According to the process of FIG. 4 described thus far, all the transistors, including the select transistor have floating gates. However, as previously discussed, the select transistor should not have such a floating gate. It can be eliminated by shorting the p1 and p2 layers, which form the floating and control gates, respectively, as previously discussed.

FIG. 4-209(*c*) shows a core array 1301 and interface with select lines. The exploded view in FIG. 4-209(*d*) of one of the core areas 1302 illustrates the p1 and p2 contacts 1303 and 1304 and metal interconnect 1305 to short the p1 and p2 contacts, as well as p-well tap 1306. FIG. 4-209(*e*) illustrates that shorting the p1 and p2 gates requires stopping the contact etch at different layers. A polysilicon cap on the transistor, as used in the process of FIG. 3, would make this etching process considerably more difficult. Thus, in the process of FIG. 4, the polysilicon cap is eliminated to facilitate the connection of the p1 and p2 layers using the metal layer 1305. On one side etching through the interlayer dielectric (ILD) and SiON and stopping at the tungsten silicide (Wsi) film to contact the poly 2 layer is required. On the other side, etching stops at the poly 1 layer and goes no further. Without the polysilicon cap, the etch process can be easily optimized to have a high oxide to poly etch selectivity and hence stop at the poly 1 layer. This simplifies the process of FIG. 4.

Step 210, which is peripheral and core gate definition requires two masks. Referring to FIGS. 4-210(*a*) through 4-210(*d*), a second gate mask (2GM) is used as shown in FIG. 4-210(*a*) to define the gate for the peripheral circuits and to partially define the core transistor gate. After etching the structure is as shown in FIG. 4-210(*b*).

FIG. 4-210(*c*) shows how a mask needed in the process of FIG. 3 is eliminated in the process of FIG. 4. FIG. 4-210(*c*) illustrates the blank (no mask) high voltage implant after the second gate etch in step 210 as shown in FIG. 4-210(*b*). After the second gate etch in the core discussed with respect to FIG. 4-210(*b*), the ONO, and p1 layers remain and are about 1100 angstroms thick. In the process of FIG. 4, the blank high voltage implant is performed with a low energy of 30 keV before removal of the second gate mask, as shown in FIG. 4-210(*c*). The implant does not penetrate the core and has no effect on the core devices. The dose shown in FIG. 4-210(*c*) is about 3E12 and is also about ten to twenty times lower than that required for a p or n type low dope drain (pLDD or nLDD) implant, such as that performed later in the process of FIGS. 3 and 4, for the n and p channel transistors in the periphery. The impact of this blank implant on the low voltage p and n channel devices is negligible because the dose is so low. Thus, performing the blank high voltage implant before removing the second gate mask resist 2GM as shown in FIG. 4-210(*c*) eliminates the need for a high voltage implant mask, as used in step 311 of the process of FIG. 3 and shown in FIG. 3-111(*a*).

A further reduction in the number of masks can be achieved at this step in accordance with the process of FIG. 4. A self align etch mask (SAE) is then used, as shown in FIG. 4-210(*d*). During the self align etch, the ONO and p1 and tunnel oxide (Tox) in the core in FIG. 4-106 are removed. In the core area the SiON/WSi/p2 stack is used as a self aligned physical mask to define a core transistor gate.

Figures 4, 211A:
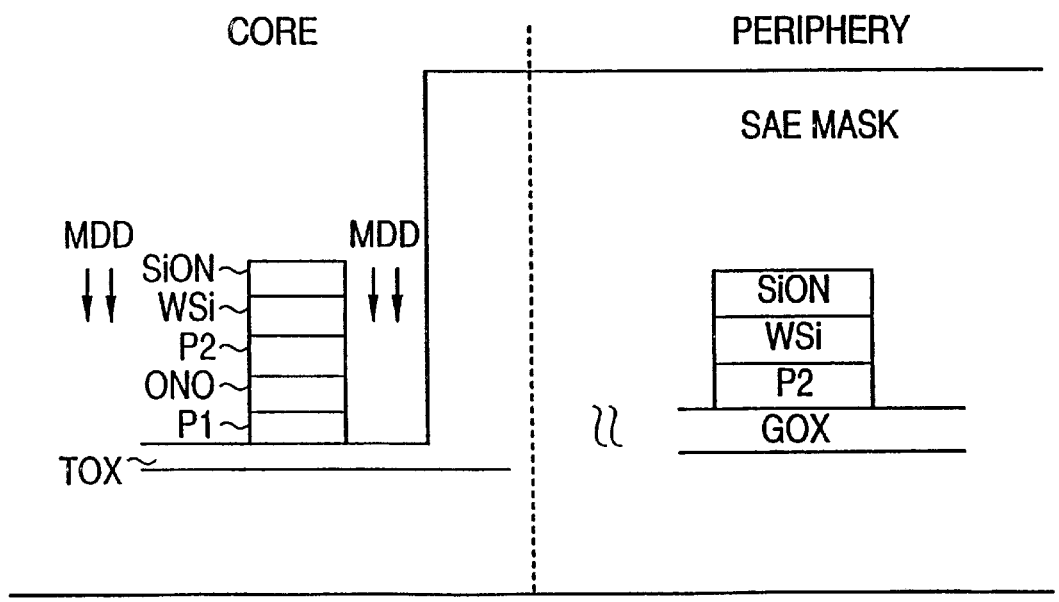

Step 211 of FIG. 4 departs from the process flow of step 111 in FIG. 3. Step 211 requires only two masks, one for each for the nLDD and pLDD implants, while the processing in step 111 requires four masks. As discussed above, the need for the high voltage implant mask as used in step 111 of the FIG. 3 process was eliminated in step 210 of the FIG. 4 process. Another difference between the processing in step 211 of FIG. 4 and step 111 of FIG. 3 is the elimination of the middle dope drain (MDD) mask in step 211. After a memory transistor is defined, an MDD implant mask is required in the process of FIG. 3 to form the source and drain regions for the core cells. This mask is not necessary in the process of FIG. 4. As shown in FIG. 4-211(a), the MDD implant proceeds without any further mask, with the SAE mask providing the masking needed for the MDD implant.

The original purpose of the MDD mask in the process flow of FIG. 3 is to cover the p-well tap area to prevent the n-type MDD implant into the p-well tap area. In the process of FIG. 4, after the self align etch (SAE), the middle dope drain implant can be applied. The SAE implant mask is modified in the process of FIG. 4 to cover the p-well area as further discussed below and shown I FIG. 4-211(c) for the MDD core source and drain implant, thereby eliminating yet another mask in the process of FIG. 4.

Figures 4, 211B:
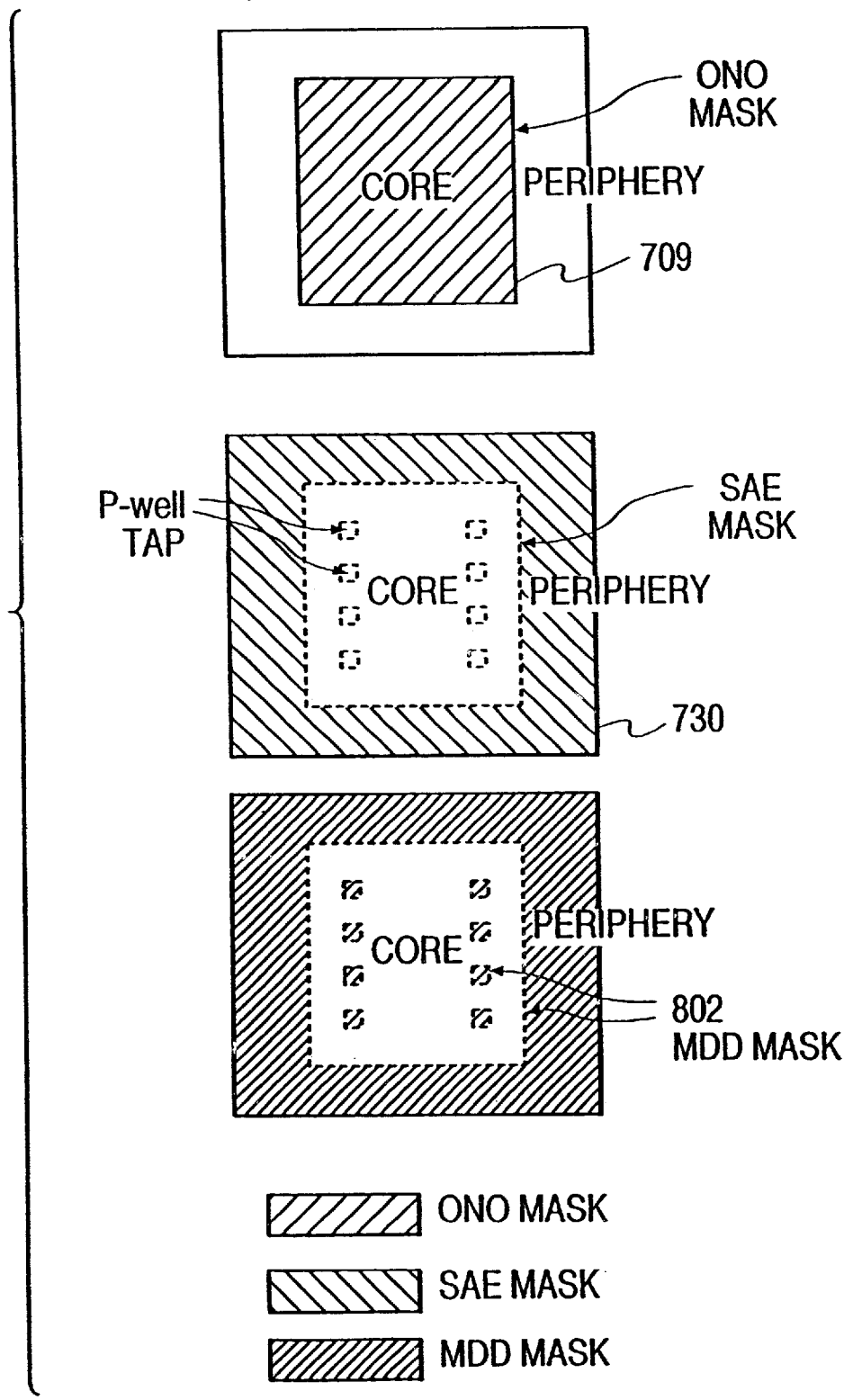
Figures 4, 211C:
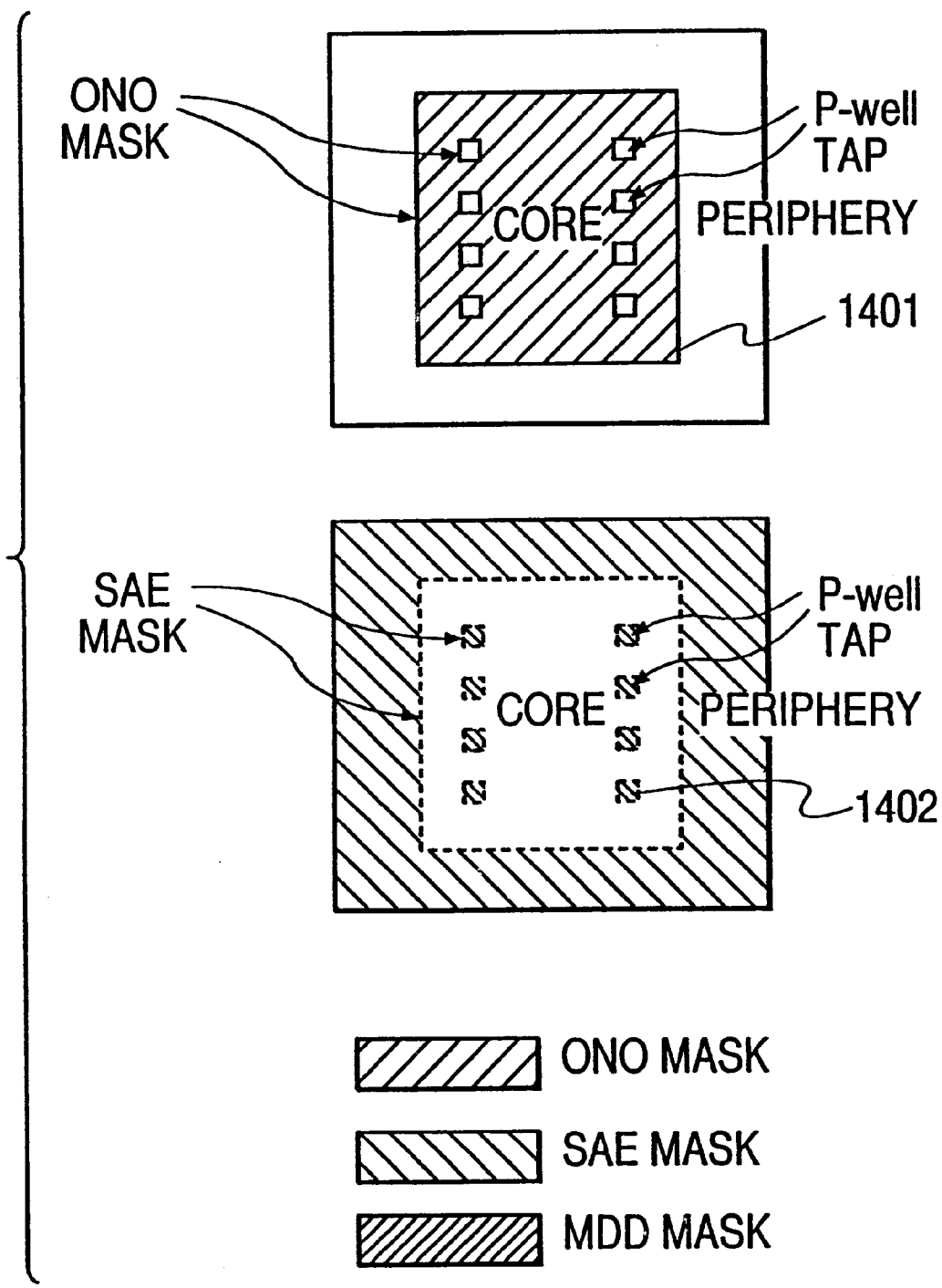

FIGS. 4-211(b) and 4-211(c) illustrate differences between the approaches in FIG. 3 and FIG. 4. FIG. 4-211(b) shows that in the process of FIG. 3, the ONO mask 709 previously discussed (see FIG. 3-107(e)) covers the entire core. This requires using the SAE mask 730 in (shown in FIG. 3-110(b)) to be used for removing the ONO and p1 layers. During the MDD implant MDD mask 802 (see FIG. 3-111(b)) is also used to cover p-well taps in the core. FIG. 4-211(c) shows that in the process of FIG. 4, the ONO mask 1401 has removed from it areas to allow etching of the ONO/p1 over the p-well tap region. During self align etch (SAE), the p-well tap areas can be covered, so that the subsequent MDD implant after SAE and before removal of the resist can be blocked into this region. Thus, it is not necessary in the process of FIG. 4 to provide a separate MDD mask, thereby eliminating a mask. Instead, the SAE mask 1402 can be used as the MDD implant mask, as well, without any additional mask as shown in FIGS. 4-211(a) and 4-211(c).

Figures 4, 211D:
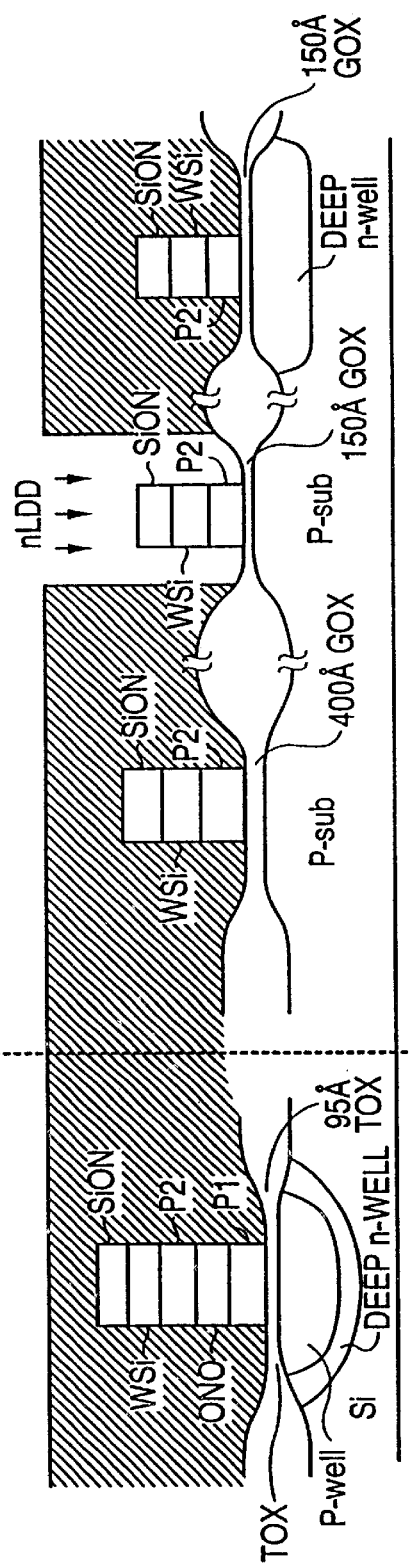
Figures 4, 211E:
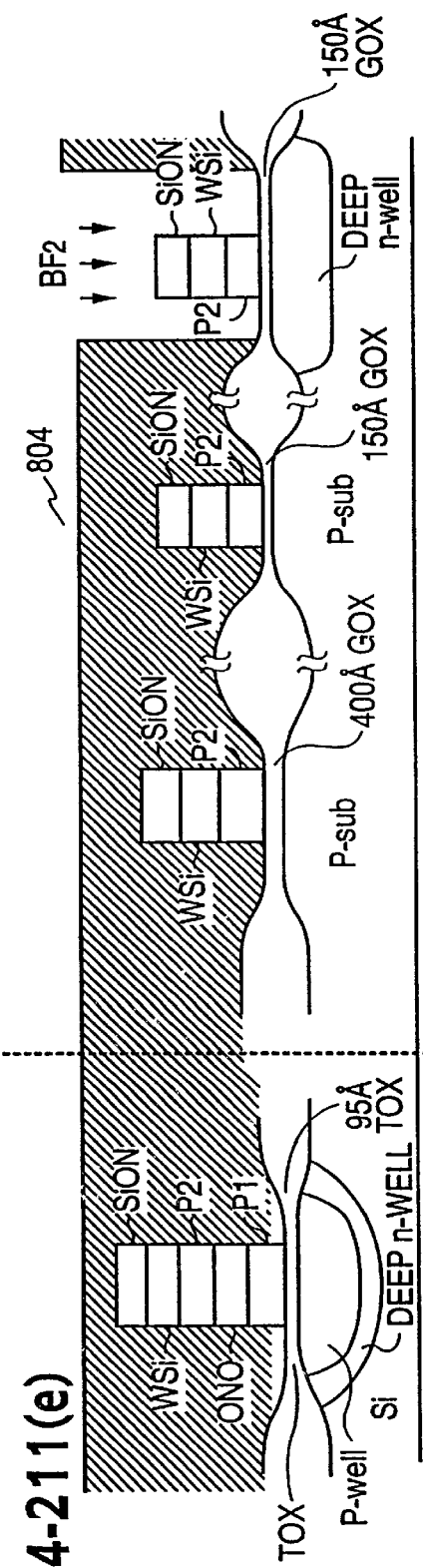

In step 211, the nLDD and pLDD implants, which each require a mask as shown in FIGS. 4-211(d) and 4-211(e), are carried out in a manner similar to that of the process in FIG. 3, as shown in FIGS. 3-111(c) and 3-111(d).

Another difference in step 211 between the FIG. 4 process and the FIG. 3 process is the method of eliminating poly 1 stringers, which can short poly floating gates between cells. The FIG. 3 process employs over-etching, but this is limited because it cuts into the silicon layers. According to the process in FIG. 4, after the etch, a HF dip is applied. Tiny stringers attach to the ONO and the HF dip lifts them off. This provides a significant improvement in yield.

As previously noted in the discussion of the process of FIG. 3, after the MDD implant, a thermal drive is performed in a furnace. Another difference between the process flow according to FIG. 3 and the process flow in FIG. 4 is that after cleaning, the process in FIG. 4 anneals the MDD implant with a longer oxidation time, but the same thermal cycle condition. This is an attempt to further oxidize any further stringers to make them nonconductive. The FIG. 4 process is distinguished from the FIG. 3 process in which a short oxidation and a nitrogen (N) anneal is performed.

Steps 212 and 213 of the process of FIG. 4 are similar to steps 112 and 113 of the process illustrated in FIG. 3.

Step 214 in the process flow of FIG. 4 also is distinguished from the process flow shown in FIG. 3. Step 114 in the process in FIG. 3 requires three masks. As previously discussed in the process of FIG. 3, first, contact holes are etched using a contact mask. Two contact implant masks, i.e., n+ and p+ contact implants, are applied to prevent n+ and p+ junction leakage. After contact implant, a tungsten stack film is deposited and then polished to form a tungsten plug. The purpose of this contact implant is to improve process margin and prevent junction leakage due to silicon gouging and misalignment. The contact implant adds an extra bottom junction layer to provide a margin of bottom junction layer material at the point where the gouging or misalignment could occur.

Figures 4, 214:
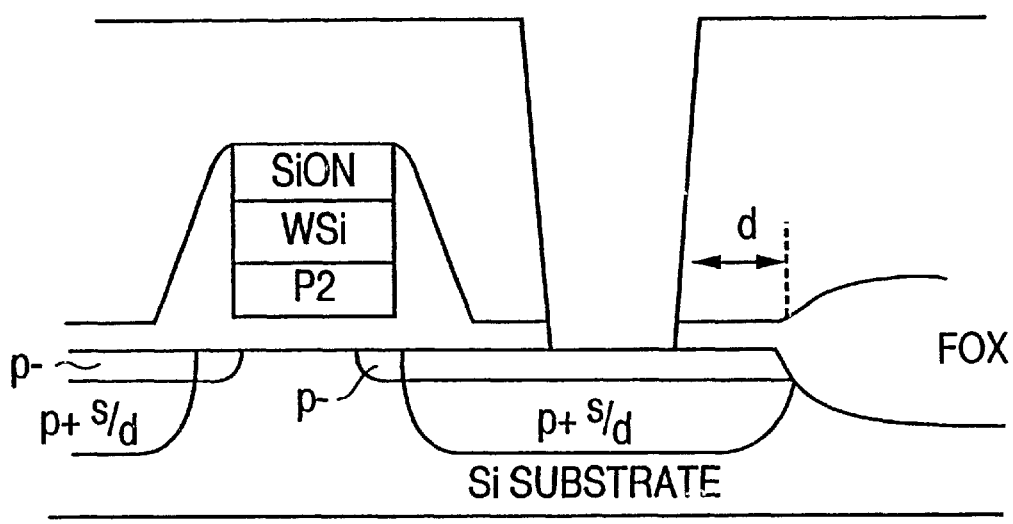

However, according to the process of the invention in FIG. 4, the p+ contact implant mask step and implant can be eliminated by establishing a design rule that insures sufficient distance "d" between the contact and field oxide edge to eliminate the need for the p+ contact implant. Such a structure is shown in FIG. 4-214. The process is also optimized to reduce the silicon gouging effects. For example, the process for contact etch, as shown in FIG. 4-214 can be optimized to be highly selective to polysilicon for stopping etch on the poly 1 layer, thereby reducing the etch rate for the silicon substrate, as well as the poly 1 layer, which results in less silicon gouging. This saves a further mask step, thereby achieving still further improvements in processing.

The metal deposition and top side and pad steps 215 and 216 generally correspond to steps 115 and 116 discussed with respect to FIG. 3.

Processes as shown herein are useful in fabricating high density flash products and architectures. One example is a high density 64 megabit device. Such products could produce a smaller cell size with a simplified manufacturing process at lower costs than can currently be achieved using standard NOR or multi-level cell NOR techniques. In addition, reliability and error free operation can be enhanced in such products. For example, such products could safely store both code and data with ten year retention, and for 100,000 program erase cycles without error correction. By way of example, such products could have read transfer rates of 20 Megabits per second, program transfer rates of 2.5 megabits per second and could erase a 8K byte block of data in 2 milliseconds. Such products are useful in digital cameras and voice recorders, as well as data recorders, telecom and networking systems, personal digital assistants, resident flash arrays and solid state disk drives. They can also be combined with a controller to form other products.

It should be understood that the invention is not intended to be limited by the specifics of the above-described embodiments, but rather defined by the accompanying claims.

We claim:

1. A semiconductor fabrication process for a NAND flash memory device having a core region and a peripheral region comprising:

initially defining the core region comprising:

laying a source/drain mask in the core region;

growing a core field oxide; and forming a deep n-well and a p-well in the core region; and defining the peripheral region comprising:
    etching source and drain regions into said peripheral region; and
    growing an oxide.

2. A process as recited in claim 1, wherein the step of forming the deep n-well and the p-well comprises laying down two masks, a first of said two masks being for said deep n-well and a second of said two masks being for said p-well.

3. A process as recited in claim 1, wherein growing the oxide comprises growing a peripheral field oxide in said peripheral region and growing an additional oxide thickness in areas in the core having a core field oxide.

4. A process as recited in claim 3, comprising implanting materials establishing threshold voltage for transistors in the core and peripheral regions.

5. A method as recited in claim 1, wherein the core field oxide is formed before the peripheral field oxide.

6. A method as recited in claim 1, wherein a core source/drain mask is used to define the core source/drain regions, a first silicon nitride layer is deposited and a core field oxide of between 1700 Å and 2000 Å is then grown.

7. As recited in claim 6, wherein said first silicon nitride layer is removed, a second silicon nitride layer is deposited, masked and etched to define peripheral source/drain region.

8. As recited in claim 7, wherein a peripheral oxide is then grown to a thickness of about 4000 Å.

9. A method as recited in claim 2 comprising applying the first mask and forming the deep n-well in the peripheral and core regions, removing the first of said masks, applying the second of said masks and generating the p-well.

10. A method as recited in claim 9 wherein said n-well is are formed by implanting phosphorous.

11. A method as recited in claim 9 wherein said p-well is formed by implanting boron.

12. A method as recited in claim 1 wherein a peripheral field oxide of between about 4000 Å and about 5000 Å is grown.

13. A method as recited in claim 3 wherein a silicon nitride layer is deposited, a mask is subsequently deposited and etched in the peripheral region before said oxide is grown.

14. A method as recited in claim 13 wherein another mask is deposited and etched in the core region and the core field oxide is subsequently grown.

15. A method as recited in claim 14 wherein said core field oxide is thinner than said peripheral field oxide.

16. A method as recited in claim 4 comprising laying an n-channel field implant mask, etching a peripheral n-channel and implanting boron through an n-channel peripheral field oxide.

17. A method as recited in claim 16 comprising implanting boron to produce a concentration of boron that isolates transistors from each other.

18. A method as recited in claim 17 comprising implanting said boron at a depth that minimizes effect on n-channel transistor performance.

19. A method as recited in claim 16 comprising laying a Vt mask, etching in said core region and implanting boron.

20. A method as recited in claim 4 comprising growing a select gate oxide over a select gate area.

21. A method as recited in claim 20 wherein the select gate oxide is grown over the p-well in the core area.

22. A method as recited in claim 21 wherein the select gate oxide is grown to a thickness of about 150 Å.

23. A method as recited in claim 22 comprising masking the select gate oxide and etching away remaining oxide over the p-well in the core region.

24. A method as recited in claim 23 comprising removing the mask over the select gate and growing an oxide over the select gate and core portion of the p-well at different rates.

25. A method as recited in claim 24 wherein a tunnel oxide is grown over the core region to a thickness of about 95 Å.

26. A method as recited in claim 25 wherein an oxide thickness of about 180 Å is grown over the select gate area.

27. A method as recited in claim 20 comprising growing a tunnel oxide layer over the select gate and core areas, said tunnel oxide layer having a different thickness over said select gate than said core.

28. A method as recited in claim 27 comprising depositing a first polysilicon layer over the tunnel oxide layer, masking portions of the core region other than over a portion of the core field oxide, etching the first polysilicon layer over the core field oxide and performing a channel stop implant in the core field oxide.

29. A method as recited in claim 28 comprising depositing an ONO layer.

30. A method as recited in claim 29 comprising masking said ONO layer over said core region and over the p-well taps in said core region and etching said peripheral region to the field oxide layer and etching over said p-well taps.

31. A method as recited in claim 30 comprising forming high and low voltage transistors, respectively.

32. A method as recited in claim 31 comprising forming said high voltage transistors with a first gate oxide and said low voltage transistors with a gate oxide thinner than said first gate oxide.

33. A method as recited in claim 32 comprising masking the core region and growing an oxide layer in the peripheral region and over the ONO layer in the core region.

34. A method as recited in claim 33 wherein said oxide layer is grown to a thickness of about 285 Å, and a first half of a boron dose is implanted through the mask.

35. A method as recited in claim 34 comprising masking high voltage transistor thick gate areas with a second Vt mask, implanting a second half of a boron dose in low voltage transistor areas, etching away oxide grown over the low voltage transistor areas, removing the second mask and growing an additional oxide layer.

36. A method as recited in claim 35 wherein said additional oxide layer is grown to about 150 Å and a remainder of said oxide layer is grown to about 400 Å.

37. A method as recited in claim 36 comprising forming a second polysilicon layer over said peripheral region and said core region.

38. A method as recited in claim 37 comprising forming a tungsten silicide layer over said second polysilicon layer and a SiON layer over said tungsten silicide layer.

39. A method as recited in claim 38 wherein transistors in the peripheral region are initially formed with floating gates and wherein select transistors are formed by shorting p1 and p2 layers forming floating and control gates.

40. A method as recited in claim 39 comprising etching to the tungsten silicide layer over the p2 layer and through an interlayer dielectric to the p1 layer and connecting the p1 and p2 layers with metal.

41. A method as recited in claim 40 wherein said etching comprises an etching process with a high oxide to polysilicon etch sensitivity.

42. A method as recited in claim 39 comprising laying a second gate mask to define transistor gates in the peripheral region and least partially define gates in the core region etching the core region to the ONO layer and etching the peripheral region to a gate oxide layer.

43. A method as recited in claim 42 comprising performing a high voltage implant.

44. A method as recited in claim 43 wherein the high voltage implant is performed with a dose of about 3E12 1/cm³ at an energy less than about 30 keV before removing the second gate mask.

45. A method as recited in claim 42 wherein the high voltage implant comprises implanting phosphorous.

46. A method as recited in claim 44 wherein the high voltage implant has substantially no effect on devices in the core region.

47. A method as recited in claim 46 wherein after etching the ONO layer and layers thereunder are about 1100 Å thick.

48. A method as recited in claim 43 comprising laying a self align etch mask and etching away unmastered ONO and p1 areas of the core region, such that a SiON, Wsi, p2 stack becomes a self aligned physical mask to define a core transistor gate.

49. A method as recited in claim 48 comprising performing a middle dope drain implant after the self align etch.

50. A method as recited in claim 49 wherein the self align mask also provides a middle dope drain mask.

51. A method as recited in claim 49 further comprising laying an n lower dope drain (nLDD) mask and performing an nLDD implant for an n-channel implant in the peripheral region.

52. A method as recited in claim 51 further comprising laying a p lower dope drain (pLDD) mask and performing a pLDD implant for a p-channel implant in the peripheral region.

53. A method as recited in claim 52 wherein the pLDD implant comprises implanting boron floride.

54. A method as recited in claim 52 comprising removing poly stringers with an HF dip.

55. A method as recited in claim 54 comprising annealing the MDD implant.

56. A method as recited in claim 55 comprising depositing a spacer oxide layer and etching to a desired configuration.

57. A method as recited in claim 56 comprising implanting n+ and p+ impurities to form a source and a drain.

58. A method as recited in claim 57 comprising depositing an interlayer dielectric.

59. A method as recited in claim 58 comprising etching contact holes using a contact mask and implanting n+ contact implants for a contact.

60. A method as recited in claim 59 wherein a predetermined distance between a contact area and an end of the field oxide is maintained.

61. A method as recited in claim 60 comprising depositing a tungsten stack film to form the contact.

62. A method as recited in claim 61 comprising depositing metalization and a topside layer.

* * * * *

UNITED STATES PATENT AND TRADEMARK OFFICE
CERTIFICATE OF CORRECTION

PATENT NO. : 6,362,049 B1
DATED : March 26, 2002
INVENTOR(S) : Cagnina et al.

It is certified that error appears in the above-identified patent and that said Letters Patent is hereby corrected as shown below:

<u>Title page,</u>
Item [75], replace "Masaatzi Higashitani" with -- Massatzi Higashitani --

Signed and Sealed this

Seventeenth Day of September, 2002

*Attest:*

JAMES E. ROGAN
*Director of the United States Patent and Trademark Office*

*Attesting Officer*